(12) United States Patent
Bodvarsson et al.

(10) Patent No.: US 12,048,088 B2
(45) Date of Patent: Jul. 23, 2024

(54) CIRCUIT BOARD

(71) Applicant: GN Hearing A/S, Ballerup (DK)

(72) Inventors: Thorvaldur Oli Bodvarsson, Værløse (DK); Maja Amskov Gravad, Valby (DK); Kamila Piotrowska, Herlev (DK)

(73) Assignee: GN HEARING A/S, Ballerup (DK)

( * ) Notice: Subject to any disclaimer, the term of this patent is extended or adjusted under 35 U.S.C. 154(b) by 0 days.

(21) Appl. No.: 17/938,912

(22) Filed: Sep. 6, 2022

(65) Prior Publication Data

US 2023/0156907 A1 May 18, 2023

(30) Foreign Application Priority Data

Nov. 17, 2021 (DK) .......................... PA 2021 70567

(51) Int. Cl.
    *H05K 1/02*     (2006.01)
    *H05K 1/18*     (2006.01)
    *H05K 3/46*     (2006.01)

(52) U.S. Cl.
    CPC ........... *H05K 1/0218* (2013.01); *H05K 1/186* (2013.01); *H05K 3/4664* (2013.01); *H05K 2201/0715* (2013.01)

(58) Field of Classification Search
    CPC .... H05K 1/186; H05K 1/0216; H05K 1/0218; H05K 2201/0715; H05K 3/4664; H05K 3/284
    See application file for complete search history.

(56) References Cited

U.S. PATENT DOCUMENTS 5,639,989 A * 6/1997 Higgins, III .......... H01L 23/552
    174/394
7,003,127 B1 * 2/2006 Sjursen .................. H04R 25/65
    381/328

(Continued)

FOREIGN PATENT DOCUMENTS

EP     1450400 A1     8/2004
EP     3840412 A1     6/2021

(Continued)

OTHER PUBLICATIONS

1st Technical Examination for Danish Patent Appln. No. PA 2021 70567 dated May 18, 2022.

(Continued)

*Primary Examiner* — William H. Mayo, III
*Assistant Examiner* — Rhadames Alonzo Miller
(74) *Attorney, Agent, or Firm* — Vista IP Law Group, LLP

(57) ABSTRACT

A method comprises: providing a circuit board comprising a first surface, an opposing second surface, and a ground connection; defining a shielding zone and a non-shielding zone on the first surface, one or more shielding-zone electronic components being comprised within the shielding zone; providing a groove in the circuit board, the groove extending along at least part of the shielding zone and being in-between the shielding zone and the non-shielding zone; applying an insulating encapsulation layer to cover the shielding zone, whereby the one or more shielding-zone electronic components are encapsulated; applying an electrically conductive shielding layer on top of at least part of the encapsulation layer and to the ground connection so as to electrically couple the shielding layer to the ground connection, whereby the one or more shielding-zone electronic components are electromagnetically shielded. Fur- (Continued)

ther, disclosed is a circuit board, and a hearing device comprising a circuit board.

21 Claims, 14 Drawing Sheets

(56) References Cited

U.S. PATENT DOCUMENTS

| | | | |
|---|---|---|---|
| 9,545,043 B1* | 1/2017 | Hamilton | H01L 23/295 |
| 2002/0129951 A1* | 9/2002 | Babb | H01L 23/552 |
| | | | 174/370 |
| 2004/0252475 A1* | 12/2004 | Tsuneoka | H01L 23/3121 |
| | | | 257/E23.125 |
| 2009/0084586 A1* | 4/2009 | Nielsen | H05K 1/0218 |
| | | | 29/829 |
| 2009/0244878 A1* | 10/2009 | Wurzel | H05K 9/0024 |
| | | | 361/818 |
| 2010/0224401 A1* | 9/2010 | Lin | H05K 9/0024 |
| | | | 361/816 |
| 2011/0115059 A1 | 5/2011 | Lee et al. | |
| 2018/0098437 A1* | 4/2018 | Gray Haley | H02G 1/1265 |
| 2022/0232742 A1* | 7/2022 | Bodvarsson | H05K 9/0024 |

FOREIGN PATENT DOCUMENTS

| | | | | |
|---|---|---|---|---|
| JP | H11135685 | | 5/1999 | |
| JP | 2002164479 A | * | 6/2002 | H01L 23/13 |
| JP | 2018-530294 | | 10/2018 | |
| WO | WO 02/43135 A1 | | 5/2002 | |
| WO | WO 2021/078541 A1 | | 4/2021 | |

OTHER PUBLICATIONS

Extended European Search Report for EP Patent Appln. No. 21208776.1 dated May 17, 2022.

* cited by examiner

CIRCUIT BOARD

RELATED APPLICATION DATA

This application claims priority to, and the benefit of, Danish Patent Application No. PA 2021 70567 filed on Nov. 17, 2021. The entire disclosure of the above application is expressly incorporated by reference herein.

FIELD

The present disclosure relates to a method of manufacturing a circuit board, a circuit board and a hearing device comprising a circuit board.

BACKGROUND

Circuit boards for advanced audio devices such as hearing devices, mobile phones, etc. undergo intense development and are made to have an increasing number of functions in a smaller area, i.e. miniaturization is in high demand. This, however, also increases the need for electromagnetic shielding of those electronic components on the circuit boards, which produce electromagnetic noise that can affect other components of the audio device as the electronic components are mounted ever closer to each other. It is therefore desirable to shield Electro-Magnetic Interference (EMI) generating electronic components on circuit boards.

One option that has been utilised is to shield the EMI-generating electronic components inside a conductive casing, such as folded sheets of metal or encapsulations. While functional, such conductive casing require space, which is in short supply in many devices.

Another option has been to construct dams around the components that were to be shielded and add a conductive shielding layer onto the electronic components within the dammed area. This process is also functional but has some drawbacks.

There is thus a need for an improved method of producing a circuit board with shielded electronic components.

It is an object to provide an improved method of manufacturing a circuit board.

It is a further object to provide an improved circuit board.

It is a further object to provide a hearing device comprising the improved circuit board.

SUMMARY

In a first aspect is provided a method of manufacturing a circuit board, in a second aspect is provided a circuit board, and in a third aspect is provided a hearing device comprising the circuit board. In the aspects, the terms and features relate to the terms and features having the same name in the other aspects and therefore the descriptions and explanations of terms and features given in one aspect apply to the other aspects.

In the first aspect, a method of manufacturing a circuit board is disclosed, the method comprises providing a circuit board comprising a first surface and an opposing second surface, the circuit board further comprising a ground connection; defining a shielding zone and a non-shielding zone on the first surface, one or more shielding-zone electronic components being comprised within the shielding zone; providing a groove in the circuit board, the groove extending along at least part of the shielding zone and being provided in-between the shielding zone and the non-shielding zone; applying an insulating encapsulation layer so as to cover the shielding zone, whereby the one or more shielding-zone electronic components are encapsulated; applying an electrically conductive shielding layer on top of at least part of the encapsulation layer and to the ground connection so as to electrically couple the shielding layer to the ground connection, whereby the one or more shielding-zone electronic components are electromagnetically shielded.

A groove is provided in the circuit board extending along at least part of the shielding zone and in-between the shielding zone and the non-shielding zone. The groove is configured so as to allow for insulating material applied during the step of applying an insulating encapsulation layer to flow into the groove, thereby reducing the risk of insulating material overflowing into the non-shielding zone, where it may e.g. cover a ground connection with which the shielding layer needs to electrically couple.

The circuit board may e.g. be a printed circuit board, PCB, the circuit board may e.g. be configured to mechanically support and electrically connect the one or more shielding-zone electronic components using e.g. conductive tracks or pads. The circuit board may comprise one or more sheet layers of a conductive layer, laminate, or film such as of copper e.g. laminated onto and/or between sheet layers of a non-conductive substrate, i.e. be a unitarily formed multi-layer board with a plurality of layers, where the plurality of layers are interleaved conductive and non-conductive layers. By unitarily formed is meant that the multilayer circuit board is manufactured so as to constitute a unit. That is, it may be constructed from individual parts, but after manufacture the individual parts form a new whole, which cannot be disassembled into the individual parts from which it was constructed. By interleaved conductive and non-conductive layers is meant the alternating layers of conductive material, usually copper, and non-conductive material, usually a dielectric substrate, which are laminated together to form part of a multilayer circuit board. The circuit board may part of a system in package electronic circuit.

A shielding zone and a non-shielding zone are defined on the circuit board, and one or more shielding-zone electronic components are comprised within the shielding zone, where the shielding-zone electronic component(s) are the electronic component(s) that are to be electromagnetically shielded. The non-shielding zone is the part of the first surface, which is not included in the shielding zone, and the non-shielding zone may comprise non-shielding zone electronic components. Thus, the shielding zone will at least partly be defined on the surface of the circuit board on which the shielding-zone electronic components are mounted. The shielding zone is a largely continuous area. In some embodiments, the shielding zone is close to one or more edges of the circuit board such as the shielding zone extends to an edge of the circuit board, i.e. the defined shielding zone goes to an edge of the circuit board.

By electronic components is meant any of a multitude of possible electronic components attachable to a circuit board. The one or more shielding-zone electronic components may be mounted on the circuit board, e.g. by being soldered on, or bonded, e.g. wire bonded or adhesive bonded, to the circuit board.

The one or more shielding-zone electronic components may comprise a power supply unit such as switch-mode power supply, e.g. comprising a switch capacitor and/or an inductor, or a processing unit, or a chip, or a receiver such as a speaker, a microphone, a filter, an antenna e.g. a magnetic radio, a battery, a transceiver, and/or an interface.

The non-shielding zone may comprise one or more non-shielding-zone electronic components, such as a speaker, a microphone, a filter, one or more antennas e.g. a magnetic induction antenna configured for emission and reception below 100 MHZ, preferably between 9 MHZ and 15 MHZ, and/or an electric antenna configured for emission and reception above 800 MHz, preferably a wavelength between 900 MHz and 6 GHz. The first frequency may be 902 MHz to 928 MHz. The first frequency may be 2.4 to 2.5 GHz. The first frequency may be 5.725 GHz to 5.875 GHz, a battery, a transceiver, and/or an interface. Any component, which cannot function satisfactorily, when shielded by an electrically conducting shielding layer, should be positioned outside the shielding zone at a safe distance.

One or more of the shielding-zone components may generate electromagnetic fields of different magnitudes and at different frequencies, thereby creating electromagnetic interference between the components, the electromagnetic interference being more or less disturbing for other components e.g. depending on the operating frequencies of the components and the magnitude of the electromagnetic fields. One or more of the shielding-zone components may generate electromagnetic fields such as electrically and/or magnetically noise. One or more of the shielding-zone components may generate electromagnetic fields such as electrical fields and/or magnetic fields.

In some embodiments, the shielding zone comprises a plurality of shielding-zone electronic components. A distance, or gap, between two neighbouring shielding-zone electronic components may preferably be such one or more of the applied layers, such as the insulating encapsulation layer and/or the electrically conductive shielding layer, may penetrate between those shielding-zone components. The gap between two neighbouring shielding-zone electronic components may e.g. be in the range from 1 µm to 1 cm, in the range from 5 µm to 5 mm, in the range from 10 µm to 1 mm, in the range from 20 µm to 500 µm, in the range from 20 µm to 200 µm, in the range from 20 µm to 100 µm, in the range from 500 µm to 1 cm, or in the range from 1 mm to 5 mm. In one or more preferred embodiments, the gap between two neighbouring components may be in the range from 20 µm to 20 mm.

Applying the insulating encapsulation layer comprises applying the insulating encapsulation layer around the one or more shielding-zone electronic components, i.e. on the surface of the circuit board and possibly other surfaces, and onto the one or more shielding-zone electronic components, so as to cover and encapsulate the one or more shielding-zone electronic components and likely an area around them, thereby protecting them from the surrounding environment in such a way that all metallic terminals/soldering of the components are covered. After application of the insulating encapsulation layer, the shielding-zone components will be positioned between the circuit board and the insulating encapsulation layer.

If applying the insulating encapsulation layer on a plurality of electronic components, applying the insulating encapsulation layer may comprise applying a portion of the insulating encapsulation layer on each electronic component individually, or applying the insulating encapsulation layer on the plurality of components such that the insulating encapsulation layer is substantially continuous on the plurality of electronic components. Applying the insulating encapsulation layer may comprise conformal coating of the insulating encapsulation layer. Conformal coating may provide a uniform insulating encapsulation layer on the one or more shielding-zone electronic components and minimize the thickness of the insulating encapsulation layer that is needed to cover the shielding-zone electronic components.

In some embodiments, applying the insulating encapsulation layer comprises applying one or more liquid encapsulation materials.

In some embodiments, applying the insulating encapsulation layer comprises applying a plurality of insulating layers, e.g. applying a first insulating layer and then a second insulating layer on at least part of first insulating layer. The insulating materials used for the plurality of layers may have different viscosities. The first insulating layer may be cured before applying the second insulating layer. Likewise, the second insulating layer may be cured before applying a third insulating layer, etc.

The insulating encapsulation layer, or one or more of the insulating layers, is an electrically non-conductive layer such that no electrical or galvanic contact can be established to the one or more shielding-zone electronic components, e.g. from the electrically conductive shielding layer. The insulating encapsulation layer, or one or more of the insulating layers, may be made of an insulating material comprising one or more polymers. The plurality of insulating layers may be of the same material.

In some embodiments, the insulating encapsulation layer or one or more of the insulating layers are made of a material with a viscosity prior to curing in the range of 0.001 Pa·s to 300 Pa·s, such as in the range of 0.01 Pa·s to 200 Pa·s., such as in the range of 0.5 Pa·s to 175 Pa·s, such as in the range of 1 to 30 Pa·s, such as in the range of 1 Pa·s-20 Pa·s, or such as in the range of 3 Pa·s to 10 Pa·s, when measured at a temperature of 20-25° C.

One or more of the materials used for the insulating encapsulation layer may be a material that cures by polymerization induced by UV light source. One or more of the materials used for the insulating encapsulation layer may be a material that cures through solvent removal induced by heating. Examples of insulating materials may be acrylated polyurethane (e.g. Electrolube® UVCL, HumiSeal® UV40, HumiSeal® UV40-250, HumiSeal® UV40 Gel, and/or HumiSeal® UV40HV), acrylate, epoxy resin (e.g. Namics® U8443, Elpeguard® SL 1367, and/or Humiseal® 1R32A-2).

One or more of the materials used for the insulating encapsulation layer may comprise and/or function as an underfill material having low viscosity, i.e. lower than 15 Pas, such as lower than 1 Pa·s, so as to allow the insulating material to penetrate around and below the one or more shielding-zone electronic components.

The electrically conductive shielding layer is applied so as to electrically couple to a ground connection (GND), such as to one or more ground pad elements, e.g. of a ground pad ring. In some embodiments, the ground connection is provided on the first surface of the circuit board. The ground connection may e.g. be a ground connection of the circuit board, a ground connection through an electronic component being connected to a ground connection of the circuit board, a ground pad ring e.g. at least partly encircling an electronic component. The ground connection may comprise one or more ground pad elements.

The ground pad ring may be an unbroken continuous ring. The ground pad ring may be formed by a number of ground pad elements arranged along a closed curve, e.g. encircling one or more electronic components. A ground pad ring having a continuous ring may provide greater flexibility for the grounding of the shielding layer. A continuous ring of the ground pad ring or a ground pad element may have a width in the range from 1 µm to 500 µm, 100 µm to 500 µm, 200 µm to 500 µm, 1 µm to 100 µm, preferably between 5-50 µm, more preferably between 10-50 µm. In some embodiments, the ground connection is provided on a surface inside the groove in the circuit board, for example the ground connection may be provided by at least a part of a conductive layer of a multilayer circuit board.

The electrically conductive shielding layer may be applied on the insulating encapsulation layer, e.g. on a first insulating layer, a second insulating layer, etc., and/or on the circuit board, i.e. the shielding layer may be applied on different surfaces as long as it electrically couples to the ground connection and electromagnetically shields the one or more shielding-zone electronic components.

In some embodiments, applying the electrically conductive shielding layer comprises applying a liquid shielding material.

In some embodiments applying the electrically conductive shielding layer comprises applying a plurality of shielding layers, e.g. applying a first shielding layer and then a second shielding layer on at least part of first shielding layer. The plurality of shielding layers may have different viscosities. The first shielding layer may be cured before applying the shielding insulating layer. Likewise, the second shielding layer may be cured before applying a third shielding layer, etc.

The electrically conductive shielding layer is an electrically conducting layer. Thus, the electrically conductive shielding layer, or one or more of the shielding layers, is made of an electrically conductive shielding material. The conductivity of the electrically conductive shielding layer may be in the range of 1 $\mu\Omega\cdot cm$ to 1000 $\mu\Omega\cdot cm$, i.e. 1 $\mu\Omega\cdot cm$ to 1 $m\Omega\cdot cm$.

One or more of the materials used for the electrically conductive shielding layer may be a shielding material that is a conductive material, e.g. an electrically conductive polymer material. One or more of the shielding material used for the electrically conductive shielding layer may be conductive polymer material, e.g. a conductive coating, e.g. based on inorganic or organic material, a conductive ink, a conductive micro-ink comprising micrometer-sized particles, or a conductive nano-ink comprising nanometer-sized particles. Examples of shielding materials may be Genes'ink® Smart spray S-CS11101, Genes'ink® Smart'ink S-CS21303, Genes'ink® Smart'ink S-CS01520, Tatsuta® AE1244, Tatsuta® AE5000A5, Tatsuta® AE5000L, Tatsuta® AE5000ST, or Tatsuta® SF-PC5600.

In some embodiments, the liquid encapsulation material and/or the liquid shielding material is applied using the jetting method, and/or the spray method, and/or the aerosol method. In some preferred embodiments, the liquid insulating encapsulation material, or one or more of the liquid encapsulation materials if a plurality of insulating layers are applied, is applied by jetting. In some embodiments, jetting an insulating material on the one or more shielding-zone electronic components may be combined with masking prior to jetting, e.g. by arranging a masking element. Jetting an insulating material may allow for a more automated and accurate application of an insulating layer, e.g. by removing human steps in the manufacturing of the electronic circuit. This may provide a higher uniformity of an applied layer, e.g. the thickness of the layers, and in turn provide more reliable layers. Further, introduction of potential human/operator-related contamination on the boards-to-be-coated can be reduced and/or prevented.

The insulating encapsulation layer is applied so as to cover at least the shielding zone, and thereby cover the one or more shielding-zone electronic components.

In some embodiments, applying the liquid encapsulation layer further comprises curing the liquid encapsulation material so as to solidify it and/or applying the liquid shielding layer further comprises curing the liquid shielding material so as to solidify it. In some preferred embodiments, the liquid encapsulation material is cured before the liquid shielding material is applied. In some embodiments, the method further comprises the step of curing the encapsulation layer and the shielding layer at the same time. Curing may comprise e.g. low-temperature curing, heat-curing, moisture-curing, UV-curing, infrared light curing, near infrared light curing, or photonic curing. The UV-curing may be performed at a wavelength in the range of 100 nm to 400 nm.

Both the application of the insulating material(s) and of the shielding material(s) may be achieved by jetting, which allows the use of the same machine for all steps. By using the same machine, the number of fabrication steps of the electronic circuit may be reduced, whereby an easier and faster fabrication process may be achieved.

A groove is provided in the circuit board, extending along at least part of the shielding zone and in-between the shielding zone and the non-shielding zone. The groove is configured so as to allow for insulating material applied during the step of applying an insulating encapsulation layer to flow into the groove, thereby reducing the risk of insulating material overflowing into the non-shielding zone, where it may a ground connection with which the shielding layer need to electrically couple.

By extending along is meant that the groove extends along at least part of the border of the shielding zone, i.e. that it extends parallel to at least part of the border of the defined shielding zone. The border of the shielding zone is where the shielding zone ends and the non-shielding zone begins. By "in-between" is not meant that the shielding zone and non-shielding zone are separated by a third zone in which the groove extends. The groove will have a physical extent, which may extend into one or both of the two defined zones, i.e. of the shielding zone and/or the non-shielding zone.

In some embodiments, the provided groove encircles the shielding zone. In some embodiments, a plurality of provided grooves encircle the shielding zone. In some embodiments, the shielding zone is close to one or more edges of the circuit board such as the shielding zone extends to an edge of the circuit board, i.e. the defined shielding zone goes to an edge of the circuit board.

In some embodiments, the maximum depth of the groove provided in the circuit board is between 5 and 200 micrometres, such as between 20 and 150 micrometres, such as between 40 and 100 micrometres, such as between 50 and 80 micrometres.

In some embodiments, the maximum width of the groove provided in the circuit board is between 100 and 500 micrometres, such as between 150 and 400 micrometres, such as between 200 and 300 micrometres.

In some embodiments, the circuit board is a multilayer circuit board comprising a plurality of layers, the plurality of layers comprising interleaved conductive and non-conductive layers, and the groove is provided in one or more of the plurality of layers. In some embodiments, providing the groove in the circuit board comprises making a through-hole in one or more layers of the plurality of layers before assembly of the multilayer circuit board. In some embodiments, the groove extends through 1-5 layers of the plurality of layers, such as through 1-4 layers of the plurality of layers, such as 1-3 layers of the plurality of layers, or wherein the groove extends through less than or equal to half of the layers of the plurality of layers, such as less than or equal to a third of the layers of the plurality of layers, such as less than or equal to a quarter of the layers of the plurality of layers.

The groove may be provided by any known method to carve, cut, punch, etc. in the materials used for circuit boards. In some embodiments, the groove is provided by performing laser cutting, or punching.

The shape of the groove may be any suitable shape. In some embodiments, the groove is a square, rectangular, or a trapezoidal groove, and/or an undercut. In some embodiments, when the groove is viewed in a cross-sectional cut that is perpendicular to the surface of the circuit board and perpendicular to the top edges of the groove, the sides of the groove, which extend into the circuit board, make a first and a fourth angle with respect to the surface of the circuit board, the first angle being the angle closer to the shielding zone and the fourth angle being the angle closer to the ground connection, the sides of the groove, which extend into the circuit board, further make a second and a third angle with respect to the bottom of the groove, the second angle being closer to the first angle, and the first angle is greater than 45 degrees, such as greater than 60 degrees, such as greater than 75 degrees, such as greater than 90 degrees.

In some embodiments, the fourth angle is less than 135 degrees, such as less than 120 degrees, such as less than 105 degrees, such as less than 90 degrees.

In the second aspect, a circuit board is disclosed, where the circuit board comprises a ground connection, a first surface and an opposing second surface, the first surface comprises a shielding zone and a non-shielding zone, one or more shielding-zone electronic components (7) being comprised within the shielding zone (11). The circuit board further comprises a groove that extends along at least part of the shielding zone and in-between the shielding zone and the non-shielding zone. The circuit board further comprises an insulating encapsulation layer on the shielding zone, whereby the one or more shielding-zone electronic components are encapsulated, and an electrically conductive shielding layer on top of at least part of the encapsulation layer, the shielding layer being coupled electrically to the ground connection, whereby the one or more shielding-zone electronic components are electromagnetically shielded.

The shielding and non-shielding zones of the circuit board are zones that are defined, where the shielding zone comprises the electronic components that are to be shielded. Ideally, the insulating encapsulation layer covers only the shielding-zone electronic components. However, often the material(s) used in the insulating encapsulation layer have a low viscosity, which is good for ensuring that the material flows well around the electronic components, and possibly under, but also means that the material can easily flow out of the intended shielding zone such that it covers at least part of the intended non-shielding zone. The groove provided in the circuit board extends along at least part of the shielding zone and in-between the shielding zone and the non-shielding zone. The groove is configured so as to allow for insulating material applied during the step of applying an insulating encapsulation layer to flow into the groove, thereby reducing the risk of insulating material overflowing into the non-shielding zone, where it may cover a ground connection with which the shielding layer needs to electrically couple.

In some embodiments, the encapsulation layer extends into the groove. In some embodiments, the encapsulation layer does not extend beyond the groove.

In some embodiments, the ground connection is provided on the first surface of the circuit board. In some embodiments the ground connection is provided on a surface inside the groove.

In some embodiments, the maximum depth of the groove in the circuit board is between 5 and 200 micrometres, such as between 20 and 150 micrometres, such as between 40 and 100 micrometres, such as between 50 and 80 micrometres.

In some embodiments, the maximum width of the groove in the circuit board is between 100 and 500 micrometres, such as between 150 and 400 micrometres, such as between 200 and 300 micrometres.

In some embodiments, the encapsulation layer comprises one or more of: an epoxy-based material, acrylated (poly) urethane, a urethane-acrylate, an acrylic, a urethane, or other polymer matrixes.

In some embodiments, the circuit board is a multilayer circuit board comprising a plurality of layers, the plurality of layers comprising interleaved conductive and non-conductive layers, and wherein the groove is provided in one or more of the plurality of layers. In some embodiments, the groove in the circuit board comprises a through-hole in one or more layers of the plurality of layers. In some embodiments, the groove extends through 1-5 layers of the plurality of layers, such as through 1-4 layers of the plurality of layers, such as 1-3 layers of the plurality of layers, or wherein the groove extends through less than or equal to half of the layers of the plurality of layers, such as less than or equal to a third of the layers of the plurality of layers, such as less than or equal to a quarter of the layers of the plurality of layers.

In some embodiments, the groove encircles the shielding zone or wherein a plurality of grooves encircle the shielding zone.

In some embodiments, the groove is a square groove, or a trapezoidal groove.

In some embodiments, when the groove is viewed in a cross-sectional cut that is perpendicular to the surface of the circuit board and perpendicular to the top edges of the groove, the sides of the groove, which extend into the circuit board, make a first and a fourth angle with respect to the surface of the circuit board, the first angle being the angle closer to the shielding zone and the fourth angle being the angle closer to the ground connection, the sides of the groove, which extend into the circuit board, further make a second and a third angle with respect to the bottom of the groove, the second angle being closer to the first angle, and wherein the first angle is greater than 45 degrees, such as greater than 60 degrees, such as greater than 75 degrees, such as greater than 90 degrees.

In some embodiments, the fourth angle is less than 135 degrees, such as less than 120 degrees, such as less than 105 degrees, such as less than 90 degrees.

In some embodiments, the shielding zone is close to one or more edges of the circuit board.

In the third aspect, is disclosed a hearing device comprising a circuit board according to the second aspect.

The hearing device is configured to be worn by a user. The hearing device may be arranged at the user's ear, on the user's ear, over the user's ear, in the user's ear, in the user's ear canal, behind the user's ear, and/or in the user's concha, i.e., the hearing device is configured to be worn in, on, and/or over the user's ear. The user may wear two hearing devices, one hearing device at each ear. The two hearing devices may be connected, such as wirelessly connected and/or connected by wires, such as a binaural hearing aid system.

The hearing device (or pair of hearing devices) may be a hearable such as a headset, headphones, earphones, ear bud, hearing aids, a personal sound amplification product (PSAP), an over-the-counter (OTC) hearing device, a hearing protection device, a one-size-fits-all hearing device, a custom hearing device or another head-wearable hearing device. Hearing devices can include both prescription devices and non-prescription devices.

The hearing device may be embodied in various housing styles or form factors. Some of these form factors are Behind-the-Ear (BTE) hearing device, Receiver-in-Canal (RIC) hearing device, Receiver-in-Ear (RIE) hearing device, or Microphone-and-Receiver-in-Ear (MaRIE) hearing device. These devices have in common that they comprise a BTE component configured to be worn behind the ear of the user and an in the ear (ITE) component configured to be inserted partly or fully into the user's ear canal. Generally, the BTE component comprises at least one input transducer, a power source, and a processing unit. The term BTE hearing device refers to a hearing device where the receiver, i.e. the output transducer, is comprised in the BTE component and sound is guided to the ITE component via a sound tube connecting the BTE and ITE components, whereas the terms RIE, RIC, and MaRIE devices refers to hearing devices where the receiver is comprised in the ITE component, which is coupled to the BTE component via a connector cable configured for transferring electric signals between the BTE and ITE components.

Some of these form factors are In-the-Ear (ITE) hearing device, Completely-in-Canal (CIC) hearing device, or Invisible-in-Canal (IIC) hearing device. These hearing devices comprise an ITE component, wherein the ITE component comprises at least one input transducer, a power source, a processing unit, and an output transducer. These form factors may be custom devices, meaning that the ITE component comprises a housing having a shell made from a hard material, such as a hard polymer or metal, moulded to have an outer shape conforming to the shape of the specific user's ear canal.

Some of these form factors are earbuds, on the ear headphones, or over the ear headphones. Some of these form factors are cochlear implant comprising a BTE component an implant component. In some embodiments, the one or more electronic components in the shielding zone comprise hearing device components, which generate electrical or/and magnetic noise (EMI).

BRIEF DESCRIPTION OF THE DRAWINGS

In the following, exemplary embodiments are described in more detail with reference to the appended drawings, wherein.

DETAILED DESCRIPTION

Figure 1:
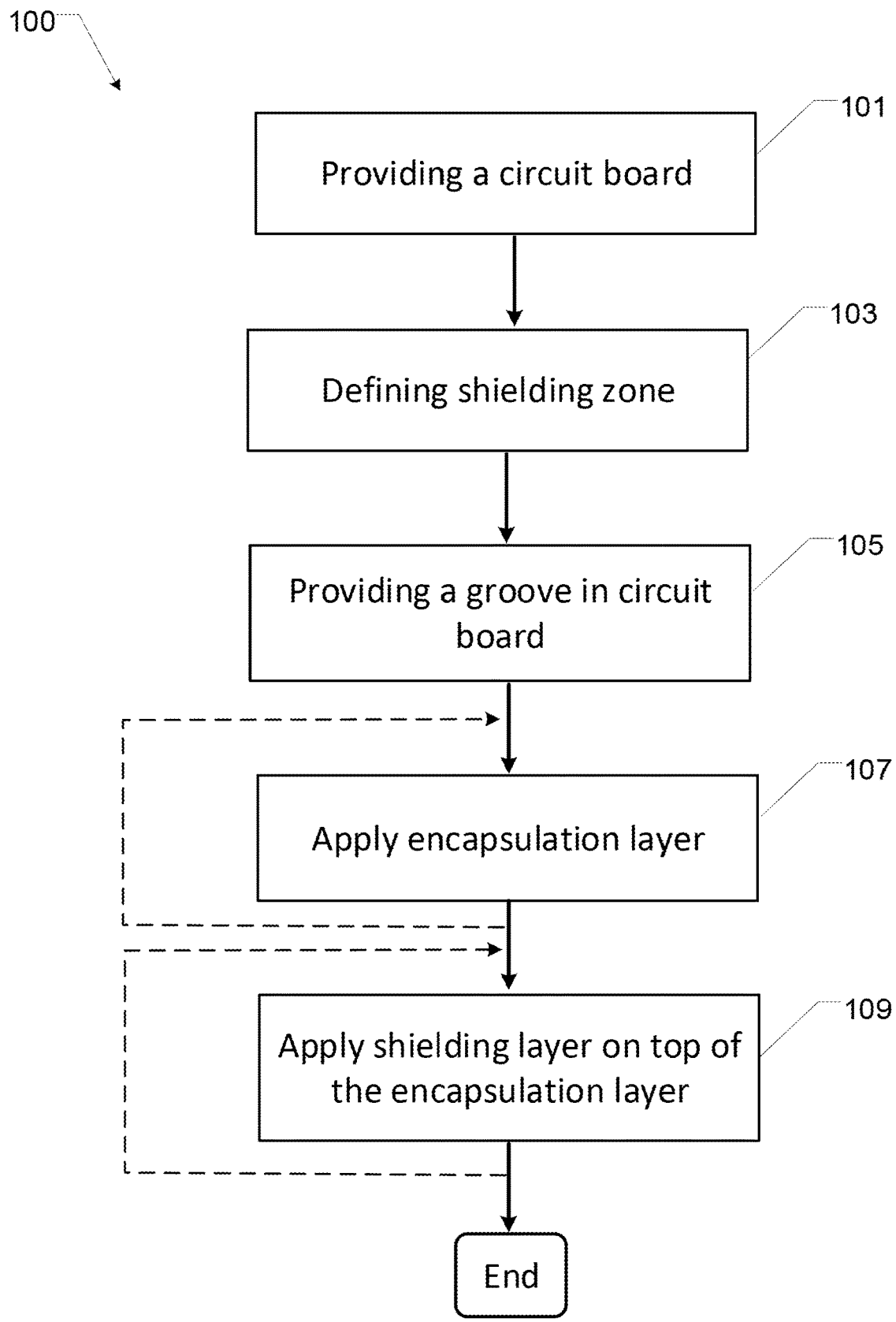
FIG. 1 shows a flow diagram illustrating some embodiments of the method of manufacturing a circuit board.

Various embodiments are described hereinafter with reference to the accompanying drawings. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

In the following various exemplary embodiments of the disclosed method of manufacturing a circuit board, a circuit board, and a hearing device comprising a circuit board are described with reference to the appended drawings. The skilled person will understand that the accompanying drawings are schematic and simplified for clarity. The elements shown in the drawings are not necessarily drawn to scale, but may primarily be illustrative of relative position, orientation, and function.

FIG. 1 shows a flow diagram illustrating some embodiments of the method 100 of manufacturing a circuit board. In step 101, a circuit board 1 is provided. The circuit board 1 has a first surface 4 and an opposing second surface 6, and at least one ground connection 9. In step 103, a shielding zone 11 and a non-shielding zone 12 are defined on the first surface 4. One or more shielding-zone electronic components 7 are positioned within the shielding zone 11, i.e. on the first surface 4 and within the shielding zone 11. In step 105, a groove 17 is provided in the circuit board 1. The groove 17 extends along at least part of the shielding zone 11 and is provided in-between the shielding zone 11 and the non-shielding zone 12. In step 107, an insulating encapsulation layer 13 is applied so as to cover the shielding zone 11, whereby the one or more shielding-zone electronic components 7 are encapsulated and thereby protected from the surrounding environment.

An adhesive layer or coating may be applied before applying a first insulating material, e.g. for promoting adhesion of the insulating layer. An adhesive layer or coating may be applied after applying the first insulating material and/or after any later applied layer or material, e.g. for promoting adhesion of a shielding layer. The viscosity of an insulating layer 13 may be chosen based on one or more of the distance or gap between two or more shielding-zone electronic components 7, the method of applying the insulating layer 13, and the type of one or more of the shielding-zone electronic components 7. For example, for a smaller distance between the shielding-zone electronic components 7, i.e. a smaller gap, the viscosity of one or more of the insulating materials may be lower than for a larger distance between the shielding-zone components 7, i.e. a larger gap, to allow the insulating material to penetrate the gaps between the electronic components 7.

The insulating encapsulation layer 13 is applied so as to cover the entire shielding zone 11, and thereby cover the one or more shielding-zone electronic components 7. Ideally, the insulating encapsulation material in the encapsulation layer 13 covers only the electronic components 7 in a defined circuitry region, i.e. ideally, the insulating encapsulation layer 13 covers only the shielding-zone electronic components 7. However, often the material(s) used in the insulating encapsulation layer 13 will have a low viscosity, which is good for ensuring that the material flows well around the shielding-zone electronic components 7, and possibly underneath, but the low viscosity also means that the material can easily flow out of the shielding zone 11 such that it covers at least part of the non-shielding zone 12. The groove 17 provided in the circuit board 1 extends along at least part of the shielding zone 11 and in-between the shielding zone 11 and the non-shielding zone 12. The groove 17 is configured so as to allow for insulating material applied during the step of applying 107 an insulating encapsulation layer to flow into the groove 17, thereby reducing the risk of insulating material overflowing into the non-shielding zone 12. Thus, ideally, the encapsulation layer 13 stops at or before the ground connection 9, and does not entirely cover the ground connection 9.

The viscosity of the one or more materials used in the insulating encapsulation layer 13 may be chosen at least in part in accordance with the distance between two or more shielding-zone electronic components 7. A lower viscosity e.g. in the range from 0.1 to 20 Pa·s may be preferred for smaller gaps e.g. gaps smaller than 500 µm, e.g. to promote the flowing of an insulating material into smaller gaps. A higher viscosity makes the insulating material less likely to flow. In prior art, a higher viscosity might have been chosen to prevent the insulating material from flowing over an edge of the circuit board or from unintentionally and unwanted covering portions of the circuit board 1, such as ground pad elements 9, which should not be covered. However, advantageously, a material having a lower viscosity may be used in the method provided and on the circuit board 1 provided as the groove 17 provides at least partly a barrier between the shielding zone 11 and the non-shielding zone 12.

More than one insulating encapsulation layer 13 may be applied, e.g. a first insulating layer may be applied and then a second insulating layer on at least part of first insulating layer, as illustrated by a dashed arrow. The materials used in the plurality of insulating layers may have different viscosities. The first insulating layer may be cured before applying the second insulating layer. Likewise, the second insulating layer may be cured before applying a third insulating layer, etc.

In step 109, an electrically conductive shielding layer 15 is applied on top of at least part of the encapsulation layer 13 and to the ground connection 9 so as to electrically couple the shielding layer 15 to the ground connection 9, whereby the one or more shielding-zone electronic components 7 are electromagnetically shielded. The shielding layer 15 may act to shield the one or more shielding-zone electronic components 7 from electromagnetic radiation, i.e. act as a Faraday cage, and/or, optionally, from other electronic components of the electronic circuit. In other words, the shielding layer 15 may prevent electromagnetic radiation from disrupting the shielding-zone electronic components 7. The shielding layer 15 may, additionally or alternatively, shield one or more unshielded electronic component(s) 5 of the circuit board from electromagnetic radiation generated by the one or more shielded electronic components 7. The shielding provided by the shielding layer 15 may be in the range of 1 dB to 160 dB depending on the frequency or frequency range to shield.

The thickness of the shielding layer 15 may depend on a frequency of the generated electromagnetic interference by the one or more shielding-zone electronic components 7 to be shielded. The frequency to be shielded may be determined based on the operating frequency of one or more electronic components of the electronic circuit. More than one shielding layer 15 may be applied, e.g. a first shielding layer may be applied and then a second shielding layer on at least part of first shielding layer, as illustrated by a dashed arrow. The materials used in the plurality of shielding layers may have different viscosities. The first shielding layer may be cured before applying the second shielding layer. Likewise, the second shielding layer may be cured before applying a third shielding layer, etc.

Figure 2:
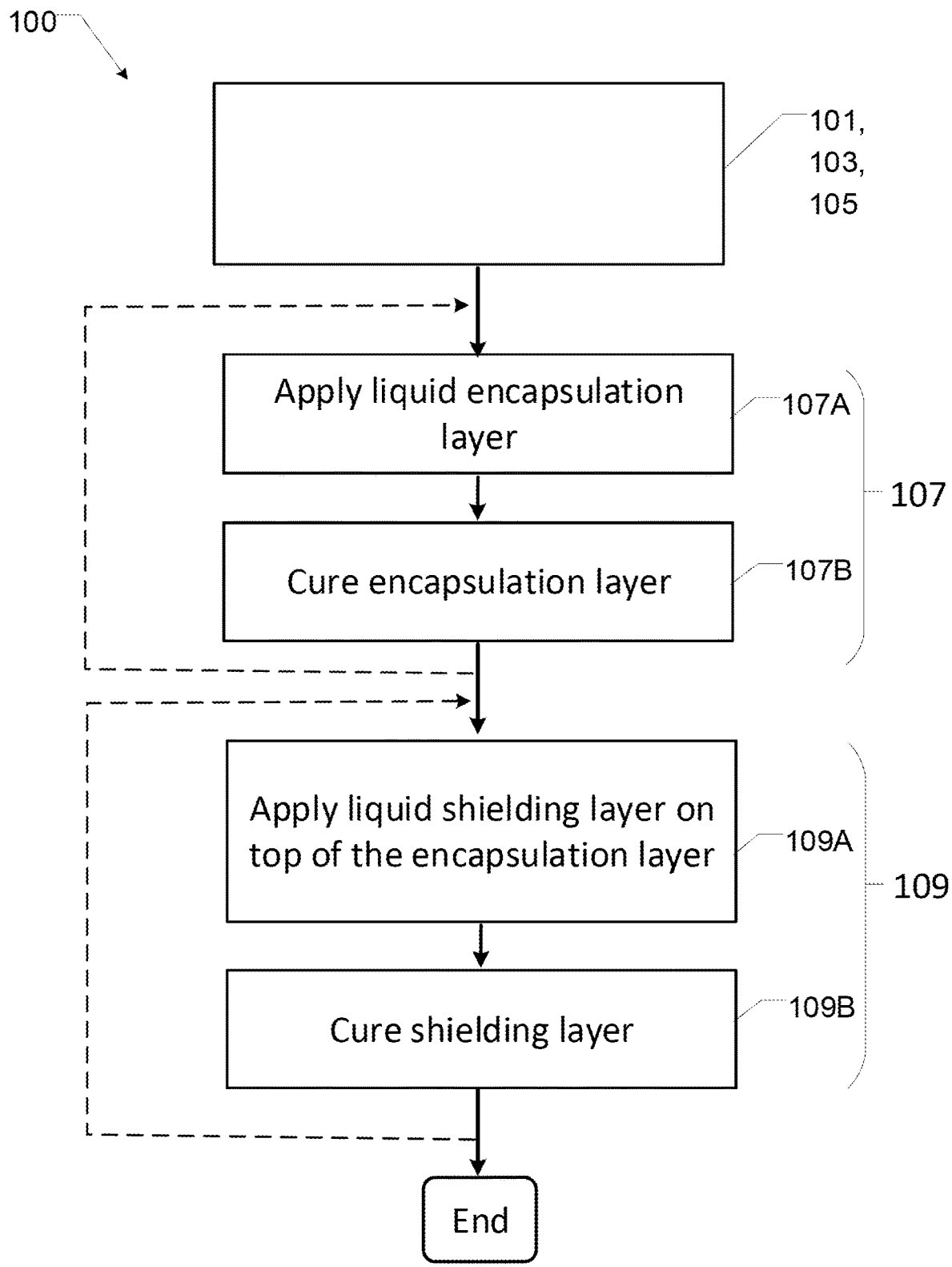
FIG. 2 shows a flow diagram illustrating some embodiments of the method of manufacturing a circuit board.

FIG. 2 shows a flow diagram illustrating some embodiments of the method 100 of manufacturing a circuit board 1, wherein steps 101, 103, and 105 may be as described for FIG. 1. In step 107, an insulating encapsulation layer 13 is applied so as to cover the shielding zone 11, whereby the one or more shielding-zone electronic components 7 are encapsulated and thereby protected from the surrounding environment. In some embodiments, step 107 comprises sub-steps 107A and 107B. In step 107A, a liquid encapsulation material is applied so as to cover the shielding zone 11, whereby the one or more shielding-zone electronic components 7 are covered. In step 107B, the liquid encapsulation material is cured so as to solidify it and encapsulate the shielding-zone electronic components 7.

More than one insulating encapsulation layer 13 may be applied, e.g. a first insulating layer may be applied and then a second insulating layer on at least part of first insulating layer, as illustrated by a dashed arrow. The materials used in the plurality of insulating layers may have different viscosities. The first insulating layer may be cured before applying the second insulating layer. Likewise, the second insulating layer may be cured before applying a third insulating layer, etc.

In step 109, an electrically conductive shielding layer 15 is applied on top of at least part of the encapsulation layer 13 and to the ground connection 9 so as to electrically couple the shielding layer 15 to the ground connection 9, whereby the one or more shielding-zone electronic components 7 are electromagnetically shielded. In some embodiments, step 109 comprises sub-steps 109A and 109B. In step 109A, a liquid shielding material is applied on top of at least part of the encapsulation layer 13 and to the ground connection 9 so as to electrically couple the shielding layer 15 to the ground connection 9. In step 109B, the liquid shielding material is cured so as to solidify it.

More than one shielding layer 15 may be applied, e.g. a first shielding layer may be applied and then a second shielding layer on at least part of first shielding layer, as illustrated by a dashed arrow. The materials used in the plurality of shielding layers may have different viscosities. The first shielding layer may be cured before applying the second shielding layer. Likewise, the second shielding layer may be cured before applying a third shielding layer, etc.

Figure 3:
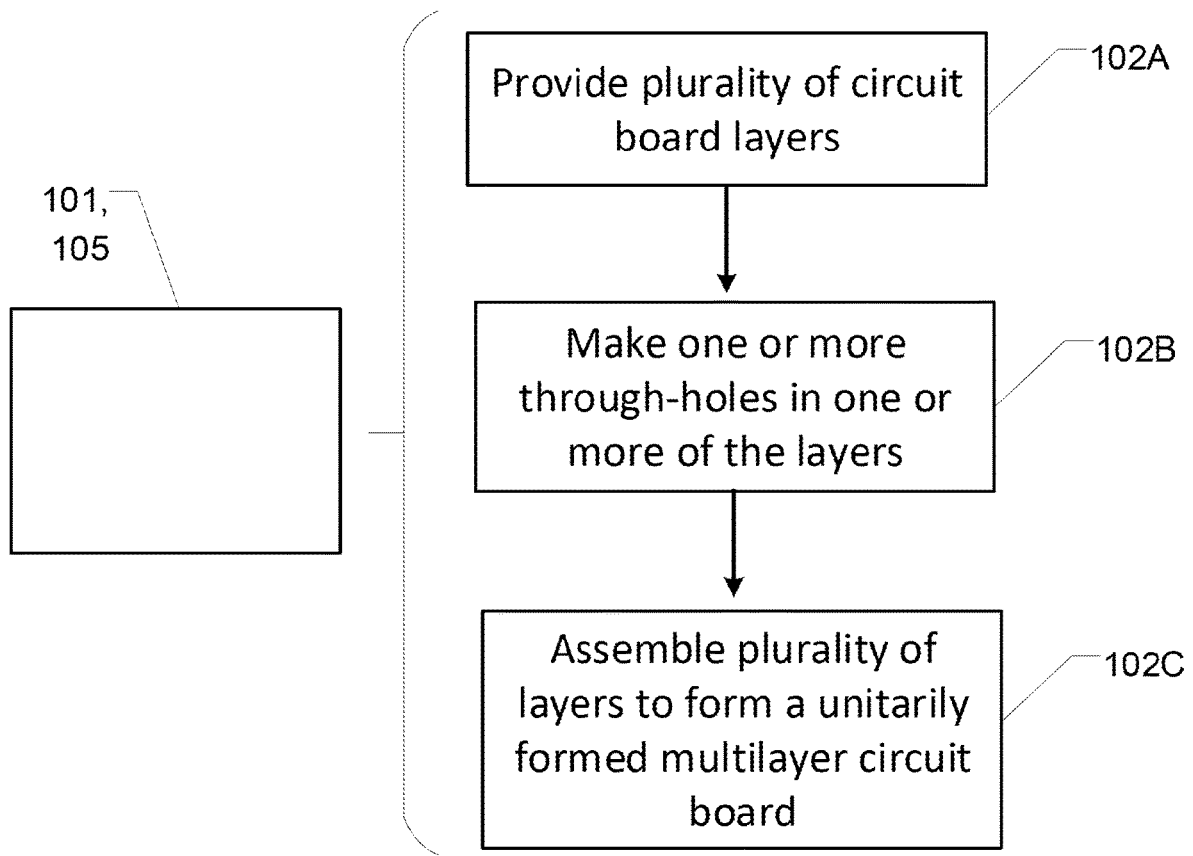
FIG. 3 shows a flow diagram illustrating some embodiments of the method of manufacturing a circuit board, FIGS. 4-5 schematically illustrate a circuit board from a view looking at the first surface, FIGS. 6-7 schematically illustrate overflow of the encapsulation layer, FIGS. 8-14 schematically illustrate a circuit board viewed from a side according to some embodiments, FIGS. 15A, 15B, and 15C schematically illustrate the geometry of the groove according to some embodiments, and FIGS. 16-17 schematically illustrate hearing devices, which comprise a circuit board according to some embodiments.

FIG. 3 shows a flow diagram illustrating some embodiments of the method 100 of manufacturing a circuit board, whereby a multilayer circuit board as shown in FIGS. 10-14 may be manufactured.

When the circuit board 1 is a unitarily formed multiplayer circuit board, the steps of providing 101 the circuit board and of providing 105 a groove in the circuit board 1 may overlap as the groove 17 may be provided by making a through-hole in one or more layers of the plurality of layers before assembly of the multilayer circuit board 1. The steps of providing 101 the circuit board and of providing 105 a groove in the circuit board 1 may comprise the sub-steps 102A, 102B, and 102C. In step 102A, a plurality of circuit board layers is provided. The plurality of circuit board layers comprises conductive 19 and non-conductive layers 21, which will be interleaved to form the multilayer circuit board. In step 102B, a through-hole is provided in one or more of the plurality of circuit board layers. The through-hole in the one or more layers is arranged such that it will form the groove 17 after assembly of the multilayer circuit board 1, i.e. such that the through-holes in the circuit board layers will overlap at least partly. In step 102C, the plurality of circuit board layers is assembled using standard methods to arrive at a unitarily formed multiplayer circuit board 1 comprising a groove 17. The groove 17 may extend through 1-5 layers of the plurality of circuit board layers, such as through 1-4 layers of the plurality of circuit board layers, such as 1-3 layers of the plurality of circuit board layers, or wherein the groove extends through less than or equal to half of the layers of the plurality of circuit board layers, such as less than or equal to a third of the layers of the plurality of circuit board layers, such as less than or equal to a quarter of the layers of the plurality of circuit board layers.

Figure 4:
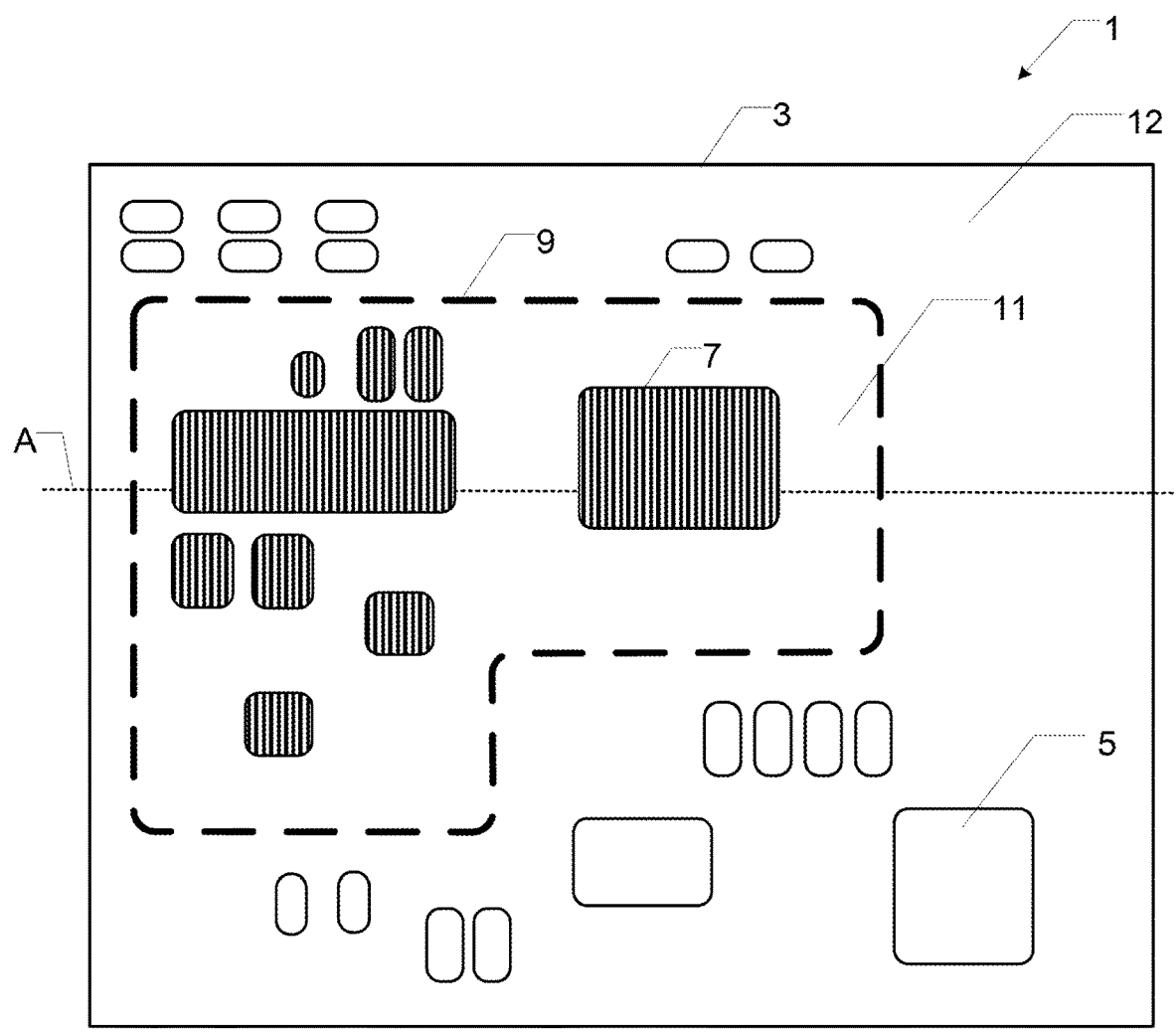

FIG. 4 schematically illustrates a circuit board 1 from a view looking at the first surface 4. The circuit board 1 is made of a substrate 3 and comprises electronic components 5, 7. A shielding zone 11 is outlined by a bold, dashed line, which is for illustration only. The shielding zone 11 comprises shielding-zone electronic components 7, which are positioned within the shielding zone 11. Likewise, the non-shielding zone 12 comprises non-shielding-zone electronic components 5, which are positioned within the non-shielding zone 12.

The electronic components 7 within the shielding zone 11 are those that require electromagnetic shielding. For example, to shield the one or more shielding-zone electronic components 7 from electromagnetic radiation, i.e. act as a Faraday cage, and/or, optionally, from other electronic components of the electronic circuit. Additionally, or alternatively, to shield one or more unshielded electronic component(s) 5 of the circuit board from electromagnetic radiation generated by the one or more shielded electronic components 7.

Figure 5:
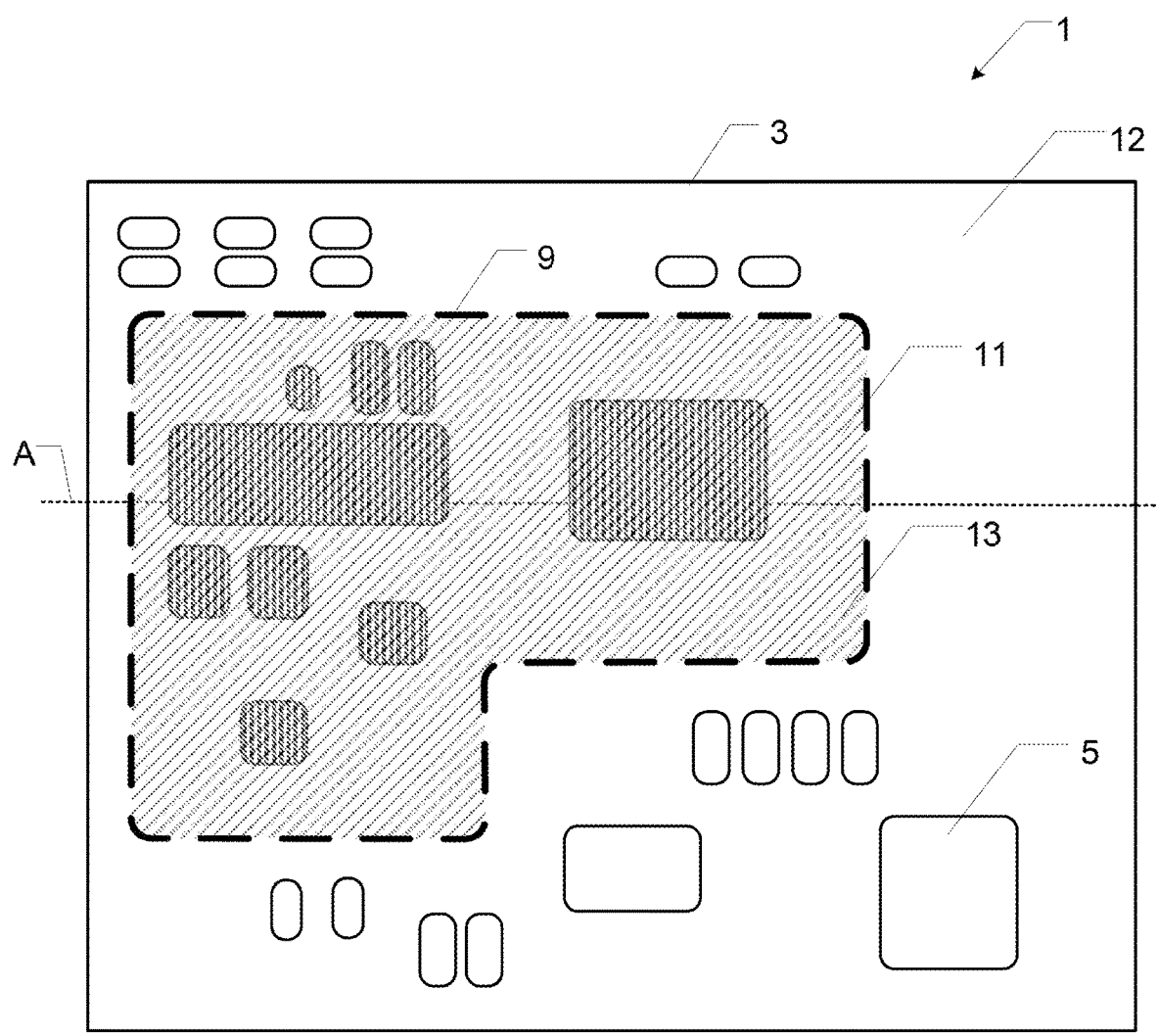

FIG. 5 schematically illustrates a circuit board 1 from a view looking at the first surface 4. The circuit board 1 may be the circuit board 1 shown in FIG. 4. A liquid encapsulation layer 13 has been applied to the shielding zone 11, as illustrated by the hatched area. The insulating encapsulation layer 13 has been applied perfectly so as to only cover the defined shielding zone 11, which is the intended area to be covered. However, often the material(s) used in the insulating encapsulation layer 13 have a low viscosity, which is good for ensuring that the material flows well around the electronic components 5, and possibly under, but which also means that the material can easily flow out of the shielding zone 11 such that it covers at least part of the non-shielding zone 12, see example in FIG. 6.

Figure 6:
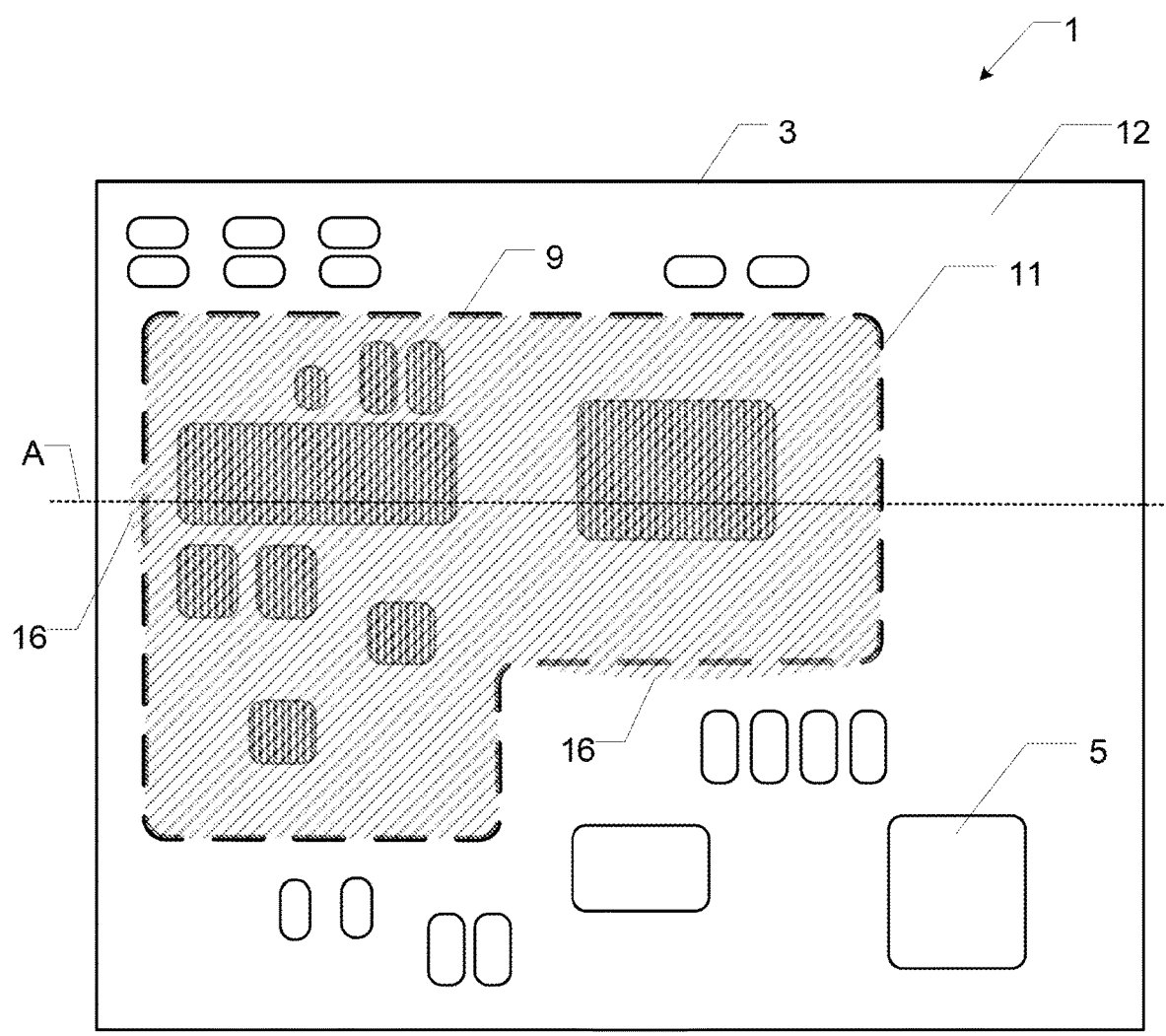

FIG. 6 schematically illustrates a circuit board 1 from a view looking at the first surface 4. The circuit board 1 may be the circuit board 1 shown in FIG. 4. Just as in the illustration in FIG. 5, a liquid encapsulation layer 13 has been applied to the shielding zone 11, as illustrated by the hatched area. However, in this instance, the liquid encapsulation material has not stayed within the shielding zone 11, but has overflown 16 the shielding zone border into the non-shielding zone 12 in two places. Such overflowing 16 may be detrimental to the functioning of the later applied shielding layer, for example if the insulating encapsulation layer 13 covers the ground connection 9, which the shielding layer 15 needs to electrically couple to, in such a way that the functionality of the shielding layer 15 is compromised, see example in FIG. 7.

Figure 7:
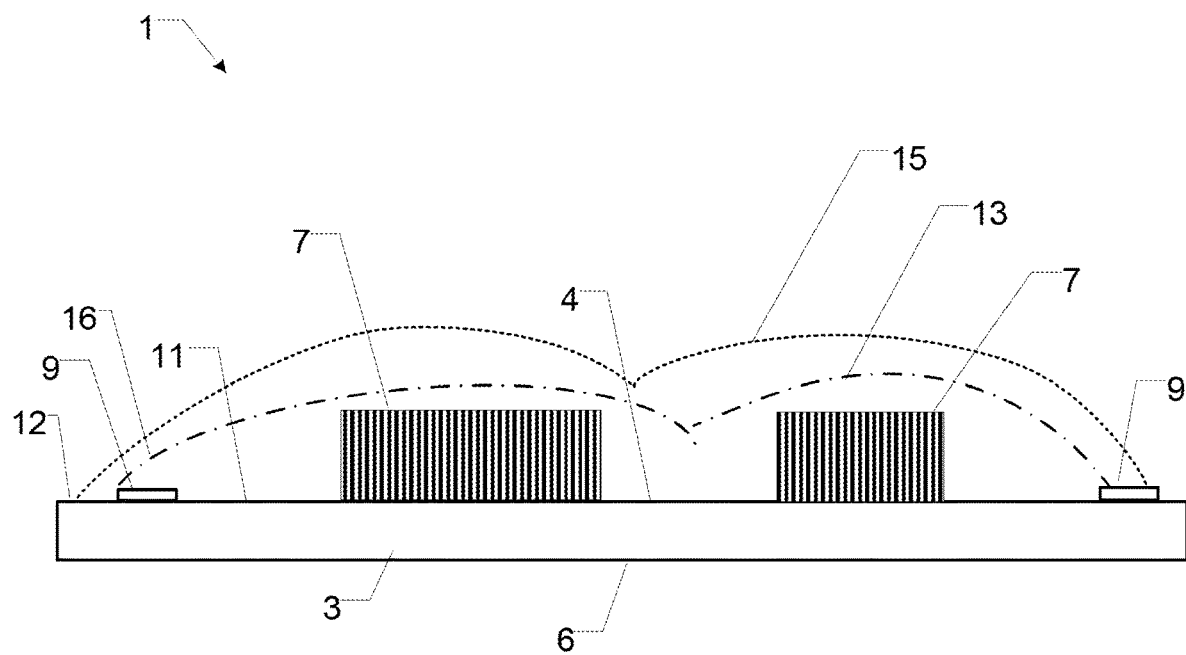

FIG. 7 schematically illustrates a circuit board 1 viewed from a side according to some embodiments. The circuit board 1 may be the circuit board 1 shown in FIG. 6 viewed as a cut along A. The circuit board 1 is illustrated with the first surface 4 towards the top of the page, and the opposite second surface 6 towards the bottom of the page. Two shielding-zone electronic components 7 are covered by an insulating encapsulation layer 13. An electrically conductive shielding layer 15 has been applied on top of the encapsulation layer 13. The encapsulation layer 13 has overflown 16 the shielding zone 11 such that it is covering the ground connection 9 shown on the left side of the page. Therefore, the shielding layer 15 cannot, as intended, couple electrically with the covered ground connection 9, which is now encapsulated in an insulating layer 13.

Figure 8:
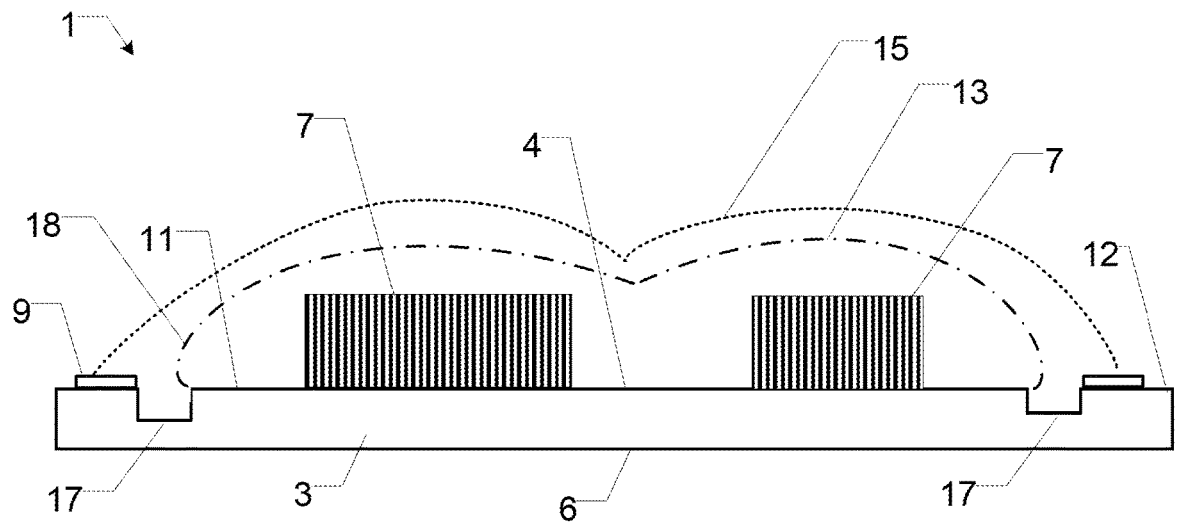

FIG. 8 schematically illustrates a circuit board 1 viewed from a side according to some embodiments. The circuit board 1 is similar to the circuit boards 1 shown in FIGS. 6 and 7, but in the circuit board 1 in FIG. 8, one or more grooves 17 have been provided in the circuit board 1. As in the illustration in FIG. 7, two shielding-zone electronic components 7 are covered by an insulating encapsulation layer 13 and an electrically conductive shielding layer 15 has been applied on top of the encapsulation layer 13. The liquid encapsulation layer 13 applied to the shielding zone 11 has formed a bulge 18 due to surface tension when flowing towards the groove(s) 17, and if not for the groove (s) 17 the encapsulation layer 13 would likely have flown out of the shielding zone 11 and into the non-shielding zone 12. Thus, the groove(s) 17 provided in the circuit board 1 solved the issue shown in FIG. 7, where the encapsulation layer 13 had flown into the non-shielding zone 12. A shielding layer 15 has been applied on top of at least part of the encapsulation layer 13 and couples electrically to the ground connection 9 such that the two shielding-zone electronic components 7 are electromagnetically shielded.

Figure 9:
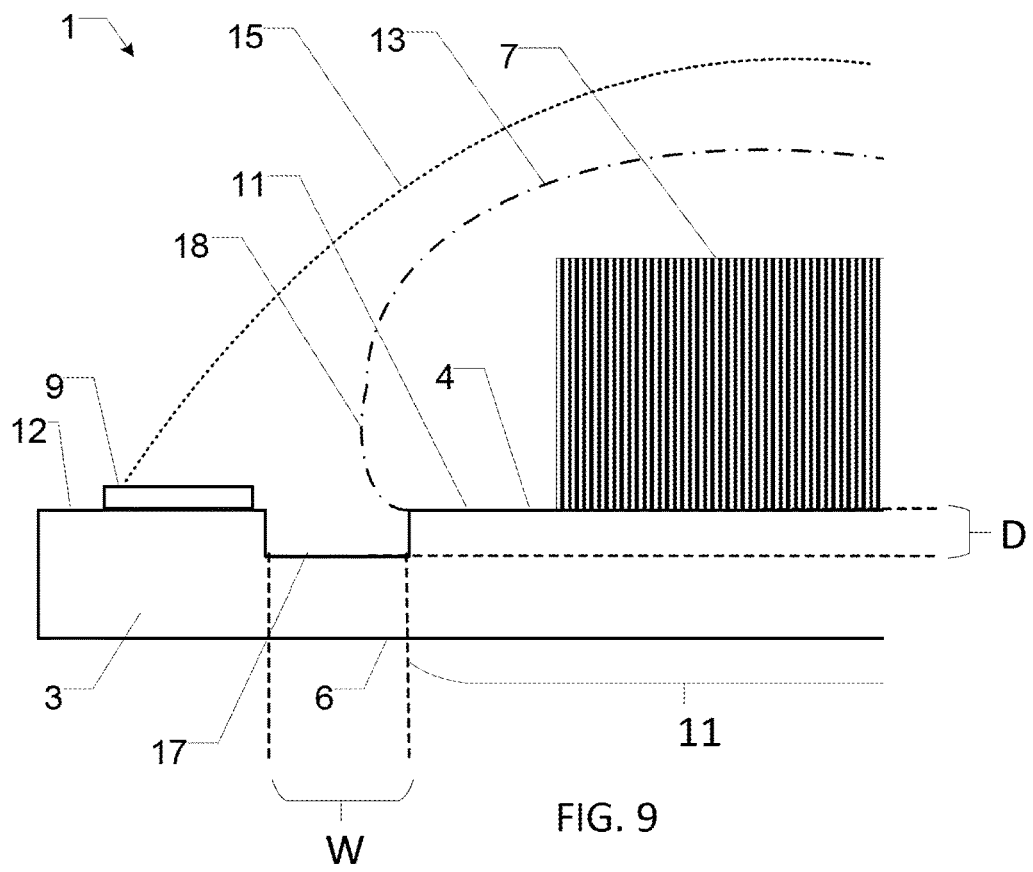

FIG. 9 schematically illustrates a circuit board viewed from a side according to some embodiments. The circuit board in FIG. 9 may be the circuit board 1 shown in FIG. 8. The shape of the groove(s) 17 may be any suitable shape. For example, the groove may be a square groove, i.e. a groove wherein the angles of its sides are all at 90 degrees, or a trapezoidal groove, and/or an undercut. The groove in FIG. 9 is shown as a square groove 17 that may be defined by a depth D and a width W. In other shapes, the groove 17 may be characterized by more than one depth and/or more than one width, and the angles of the its sides may be different from 90 degrees. The liquid encapsulation layer 13 applied to the shielding zone 11 has formed a bulge 18 due to surface tension when flowing towards the groove(s) 17, and if not for the groove(s) 17 the encapsulation layer 13 would likely have flown out of the shielding zone 11 and into the non-shielding zone 12. Thus, the groove(s) 17 provided in the circuit board 1 solved the issue shown in FIG. 7, where the encapsulation layer 13 had flown into the non-shielding zone 12. A shielding 15 has been applied on top of at least part of the encapsulation layer 13 and couples electrically to the ground connection 9 such that the shielding-zone electronic component 7 is electromagnetically shielded.

Figure 10:
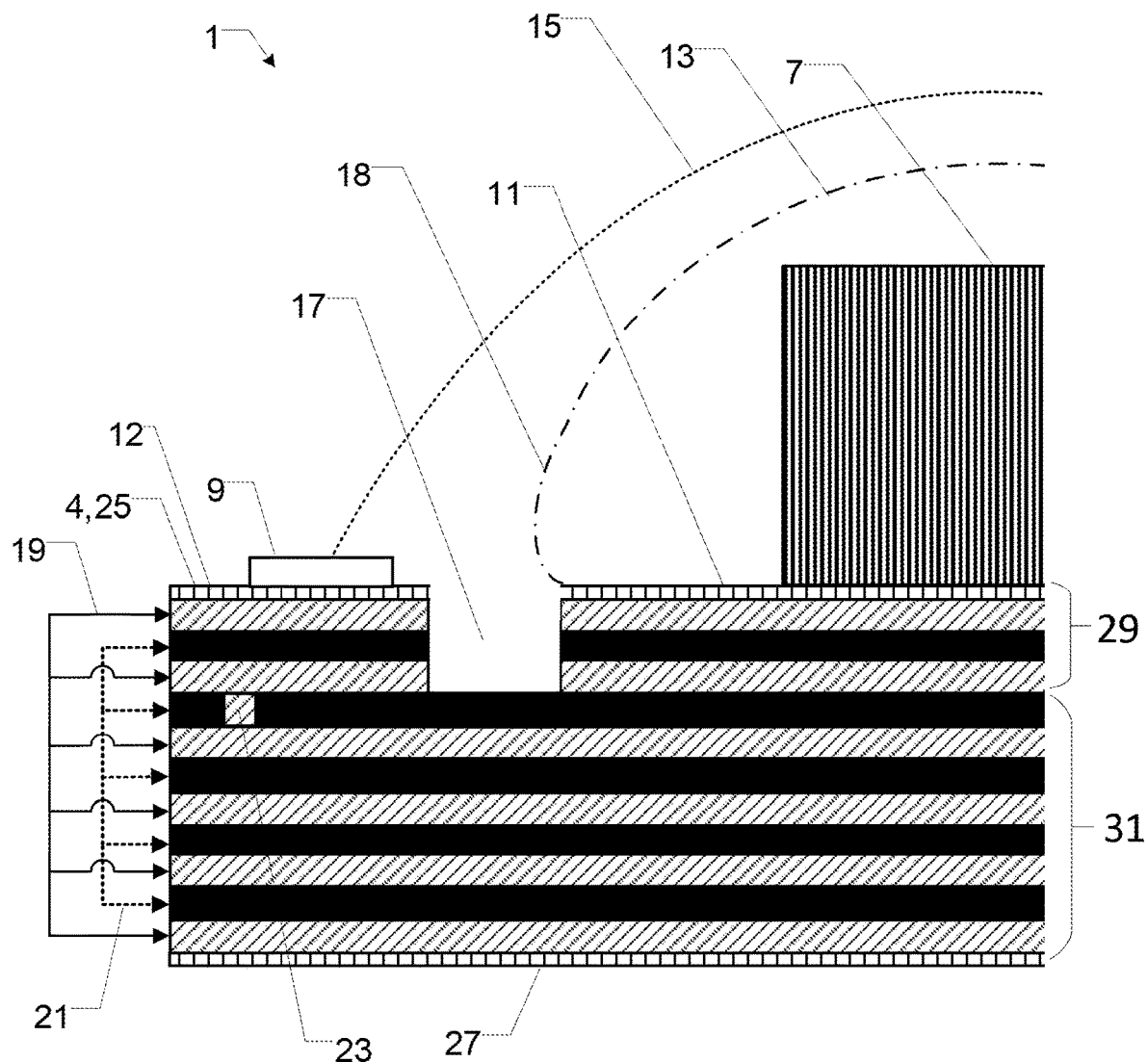

FIG. 10 schematically illustrates a circuit board 1 viewed from a side according to some embodiments. The circuit board 1 is a unitarily formed multilayer circuit board comprised of interleaved conductive 19 and non-conductive 21 circuit board layers with vias 23 between the conductive layers 19, and a top 25 and bottom layer 27. A groove 17 has been provided in the circuit board 1 as an arrangement of aligned through-holes in three of the plurality of circuit board layers as well as in the top layer 25. The through-holes may have been made before or after assembly of the multilayer circuit board 1. Thus, the multilayer circuit board comprises cut layers 29 and uncut layers 31. The liquid encapsulation layer 13 applied to the shielding zone 11 has formed a bulge 18 due to surface tension when flowing towards the groove(s) 17, and if not for the groove(s) 17 the encapsulation layer 13 would likely have flown out of the shielding zone 11 and into the non-shielding zone 12. Thus, the groove(s) 17 provided in the circuit board 1 solved the issue shown in FIG. 7, where the encapsulation layer 13 had flown into the non-shielding zone 12. A shielding 15 has been applied on top of at least part of the encapsulation layer 13 and couples electrically to the ground connection 9 such that the shielding-zone electronic component 7 is electromagnetically shielded.

Figure 11:
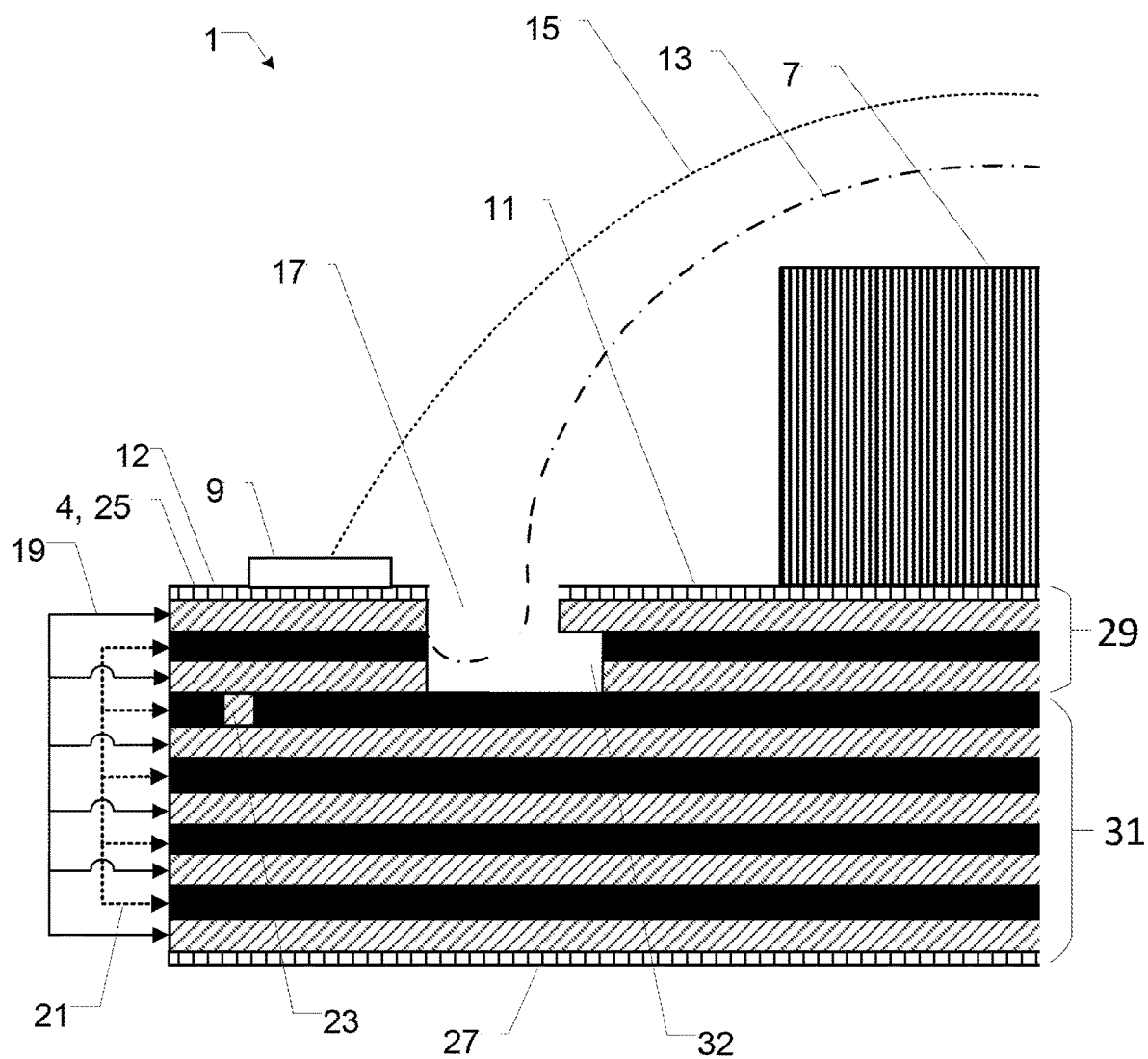

FIG. 11 schematically illustrates a circuit board 1 viewed from a side according to some embodiments. The circuit board 1 is a unitarily formed multilayer circuit board similar to the circuit board shown in FIG. 10, however, in contrast the groove 17 has been made with a one-sided undercut 32. The liquid encapsulation layer 13 applied to the shielding zone 11 has flown into the groove 17, and if not for the groove 17 the encapsulation layer 13 would likely have flown out of the shielding zone 11 and into the non-shielding zone 12. Thus, the groove 17 provided in the circuit board 1 solved the issue shown in FIG. 7, where the encapsulation layer 13 had flown into the non-shielding zone 12. A shielding 15 has been applied on top of at least part of the encapsulation layer 13 and couples electrically to the ground connection 9 such that the shielding-zone electronic component 7 is electromagnetically shielded. Additionally, it may be arranged that the shielding layer 15 can couple electrically with one or more of the conductive circuit board layers 19 making up the sides of the groove 17. For example, the shielding layer 15 may be able to couple electrically with the top conductive circuit board layer 19 as shown in FIG. 11. This may be utilised to save space on the circuit board 1 as the surface-mounted ground connection 9 may not be needed, see FIG. 12 for another example.

Figure 12:
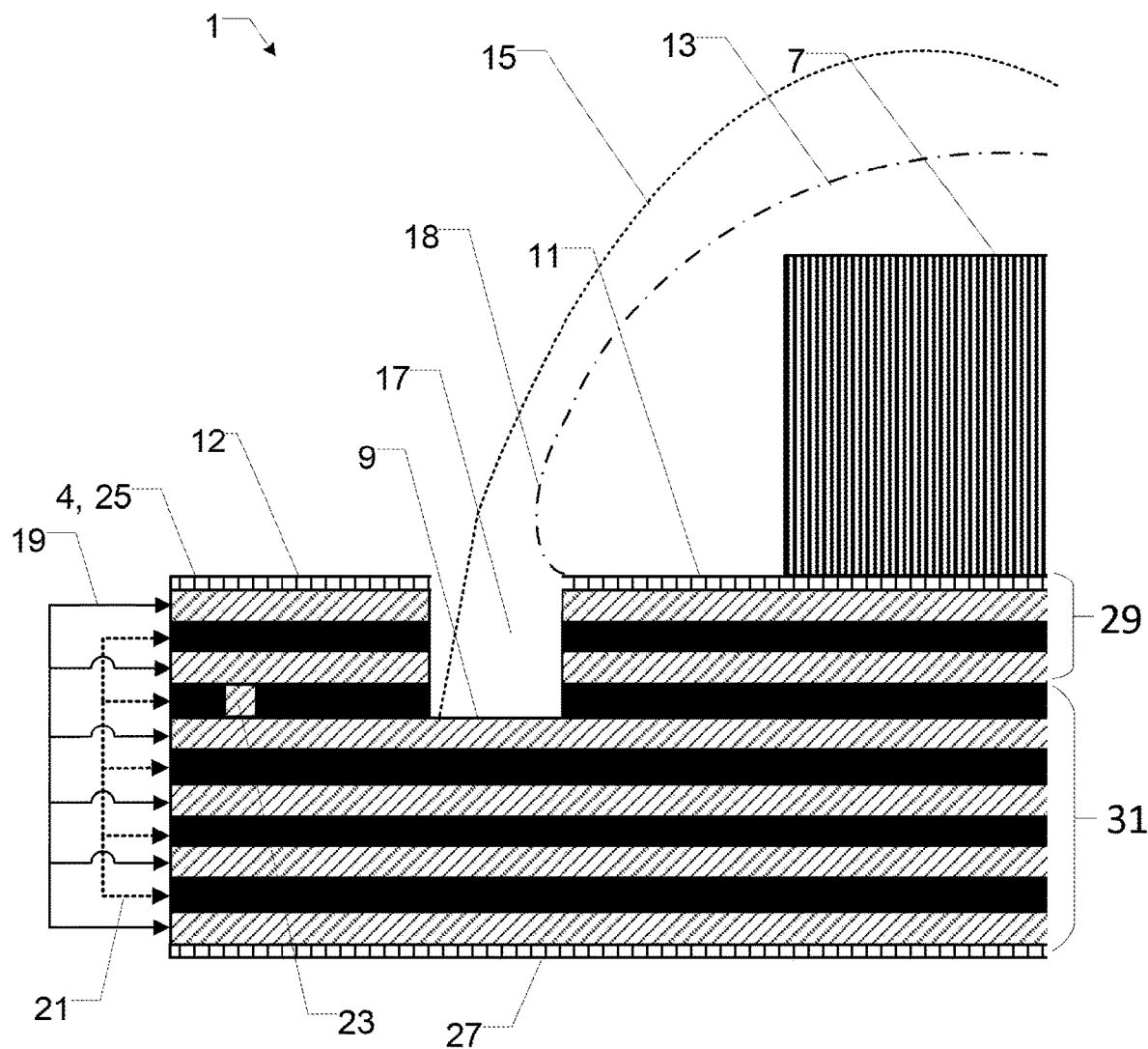

FIG. 12 schematically illustrates a circuit board 1 viewed from a side according to some embodiments. The circuit board 1 is a unitarily formed multilayer circuit board similar to the circuit board shown in FIG. 10, however, in contrast the circuit board layer, which forms the bottom of the groove 17 is a conductive circuit board layer 19, which is grounded. The liquid encapsulation layer 13 applied to the shielding zone 11 has formed a bulge 18 due to surface tension when flowing towards the groove(s) 17. This has made it possible for the shielding layer 15 to connect to ground 9 in the bottom of the groove 17 thus saving the space taken up by a ground connection 9 on the first surface/top layer 4, 25 of the circuit board 1. The space taken up by a surface-mounted ground connection 9 on the first surface/top layer 4, 25 of the circuit board 1 can have a width of e.g. 2-400 μm and, advantageously, that space may be saved. Even if some of the encapsulation layer 13 had flown into the groove 17, it could be arranged that the shielding layer 15 could connect to one or more of the conductive circuit board layers 19 making up the sides of the groove 17 as discussed also in connection with FIG. 11.

Figure 13:
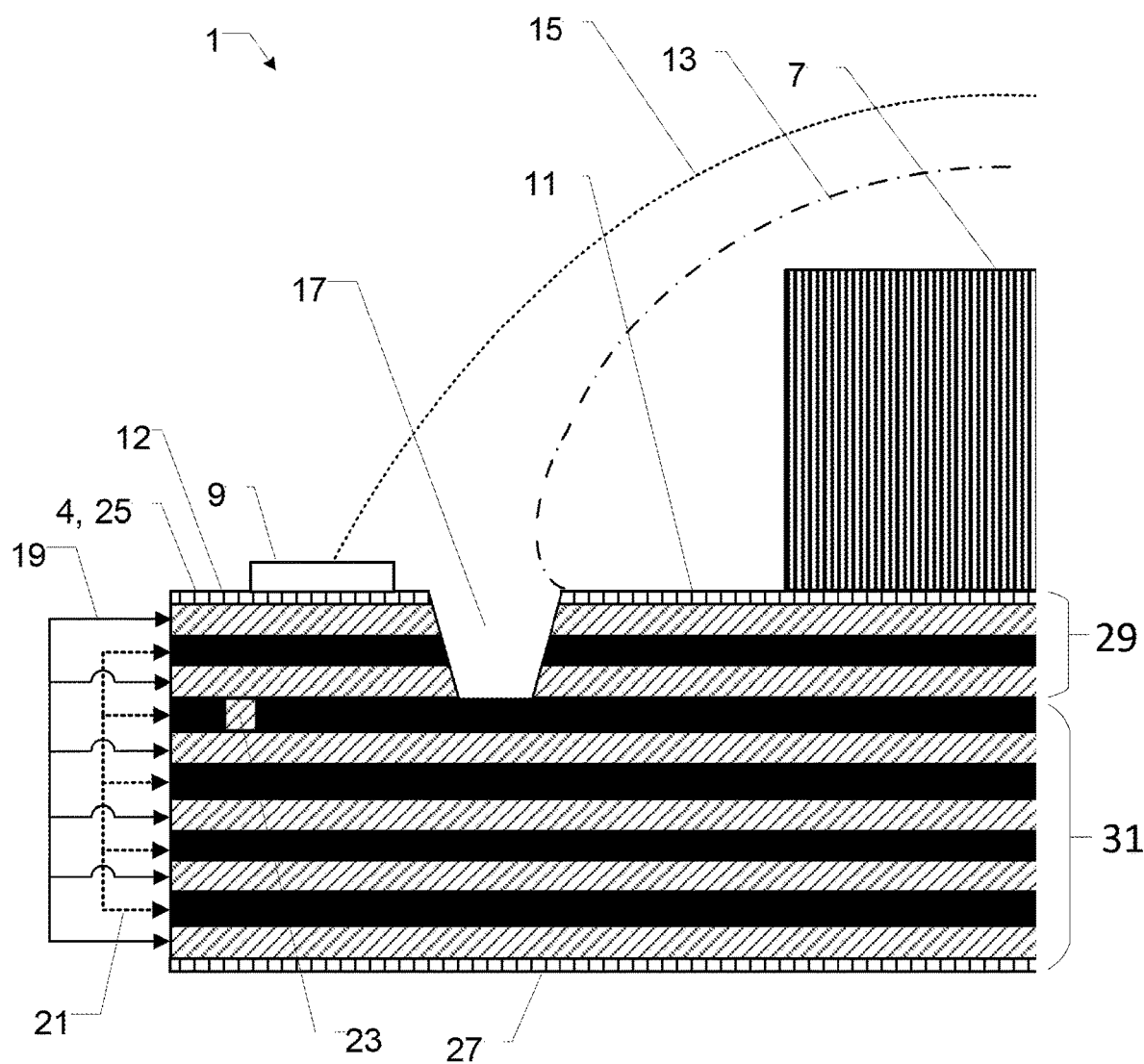

FIG. 13 schematically illustrates a circuit board 1 viewed from a side according to some embodiments. A trapezoidal groove 17 has been provided in the circuit board 1, i.e. it is the cross-sectional shape, which is trapezoidal. The groove may be provided by any known method to carve, cut, punch, etc. in the materials used for circuit boards. For example, the groove is provided by performing laser cutting, and/or punching. The circuit board 1 is a unitarily formed multilayer circuit board, but the trapezoidal groove may be provided in any type of circuit board. A trapezoidal groove is characterised by four angles, as further illustrated in FIG. 14.

Figure 14:
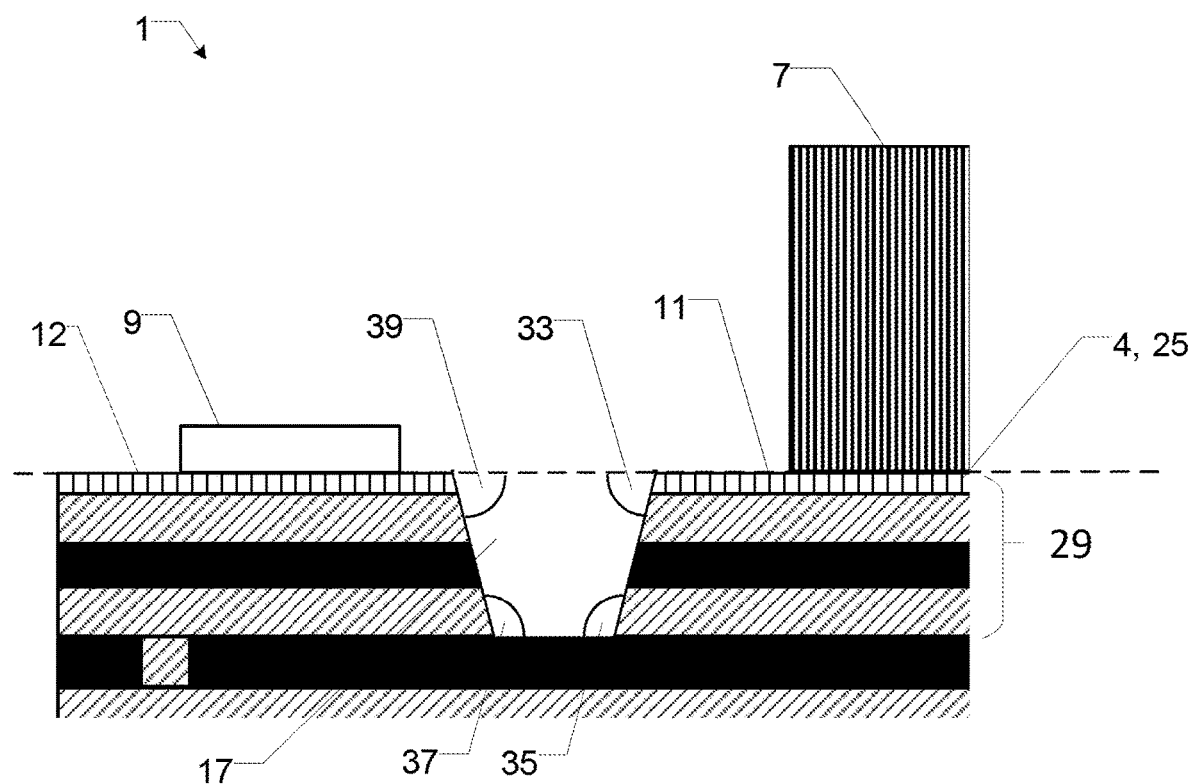

FIG. 14 schematically illustrates a circuit board 1 viewed from a side according to some embodiments. A trapezoidal groove 17 has been provided in a unitarily formed multilayer circuit board 1. When the groove 17 is viewed in a cross-sectional cut that is perpendicular to the surface of the circuit board and perpendicular to the top edges of the groove, as in FIG. 14, the sides of the groove 17, which extend into the circuit board, make a first 33 and a fourth 39 angle with respect to the first surface 4 of the circuit board 1. The first angle 33 is the angle closer to the shielding zone 11 and the fourth angle 39 is the angle closer to the non-shielding zone 12. The sides of the groove 17, which extend into the circuit board 1, further make a second 35 and a third 37 angle with respect to the bottom of the groove 17, the second 35 angle being closer to the first 33 angle. In the example of a groove 17 illustrated in FIG. 14, the first 33 and fourth 39 angles are the same and acute, i.e. less than 90 degrees, and the second 35 and third 37 angles are the same and obtuse, i.e. more than 90 degrees. The bottom side is parallel to the surface of the circuit board and the two sides of the groove 17 are not parallel. For the trapezoidal groove the four angles 33, 35, 37, 39 can be optimised so as to achieve the desired technical effect of reducing the risk of the encapsulation layer 13 overflowing out of the shielding zone 11.

Figures 15A, 15B, 15C:
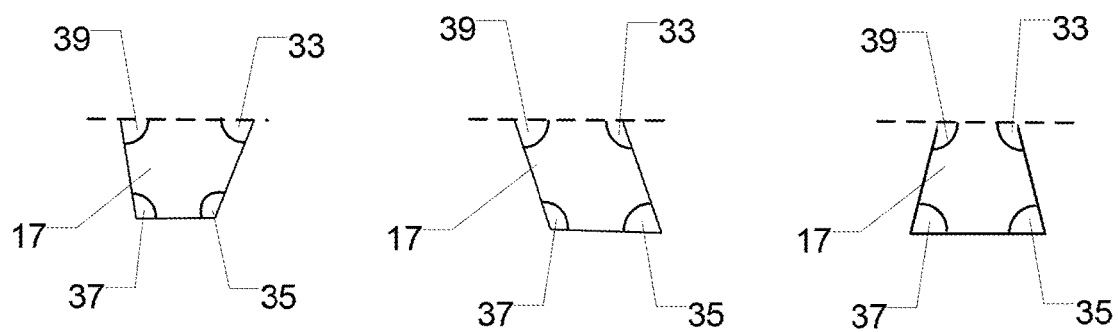

FIGS. 15A, 15B, and 15C schematically illustrates the geometry of the groove 17 according to some embodiments. In FIG. 15A is shown an example of a trapezoidal groove 17, wherein all the four angles 33, 35, 37, 39 are different. The first 33 and fourth 39 angles are acute, i.e. less than 90 degrees, and the second 35 and third 37 angles are obtuse, i.e. more than 90 degrees. The bottom side is parallel to the surface of the circuit board and the two sides of the groove 17 are not parallel. In FIG. 15B is shown an example of a trapezoidal groove 17, wherein the first 33 and third 37 angles are obtuse, and the second 35 and fourth 37 angles are acute. All four angles are different from each other. The two sides of the groove 17 are parallel, and the bottom side is not parallel to the surface of the circuit board. In FIG. 15C is shown an example of a trapezoidal groove 17 that is wider at the bottom than at the top. The first 33 and the fourth 39 angles are the same and obtuse, and the second 35 and third 37 angles are the same and acute.

Figure 16:
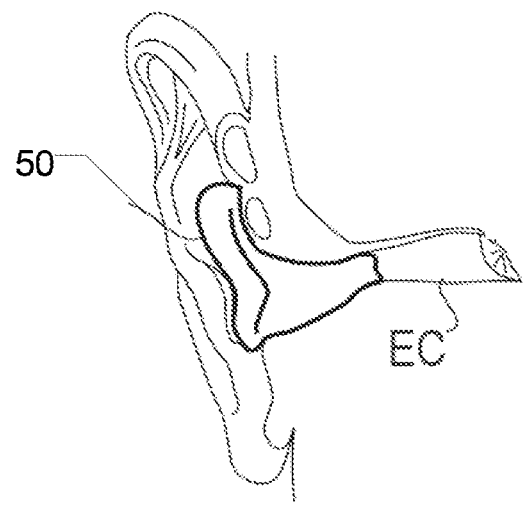

FIG. 16 schematically illustrates an in-ear-type hearing device 50, which comprises a circuit board 1 according to some embodiments. The in-ear-type hearing device 50 is designed to be placed at least partly within the ear canal EC of the user during use. Hearing devices generally, and in particular the in-ear-type, are pressed for space and circuit boards 1 for such devices need to have a small form-factor. Therefore, the electronic components are made ever smaller and positioned closer and closer together. In addition, hearing devices often comprise both electronic components, which produce electromagnetic noise, and electronic components, which are sensitive to electromagnetic noise.

Therefore, such devices can advantageously make use of an improved circuit board 1 as disclosed herein.

Figure 17:
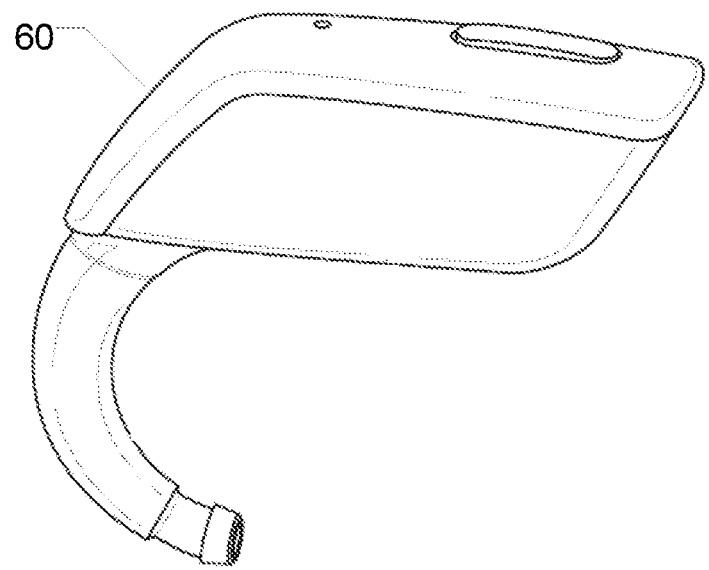

FIG. 17 schematically illustrates a behind-the-ear-type hearing device 60, which comprises a circuit board 1 according to some embodiments. Hearing devices generally, and in particular the in-ear-type, are pressed for space and circuit boards 1 for such devices need to have a small form-factor. Therefore, the electronic components are made ever smaller and positioned closer and closer together. In addition, hearing devices often comprise both electronic components, which produce electromagnetic noise, and electronic components, which are sensitive to electromagnetic noise. Therefore, such devices can advantageously make use of an improved circuit board 1 as disclosed herein.

Although features have been shown and described, it will be understood that they are not intended to limit the claimed invention, and it will be made obvious to those skilled in the art that various changes and modifications may be made without departing from the spirit and scope of the claimed invention. The specification and drawings are accordingly to be regarded in an illustrative rather than restrictive sense. The claimed invention is intended to cover all alternatives, modifications, and equivalents.

LIST OF REFERENCES

1 Circuit board
3 Substrate
4 First surface
5 Unshielded electronic components/non-shielding-zone electronic components
6 Second surface
7 Shielded electronic components/shielding-zone electronic components
9 Ground ring/Shield ring/Ground connection
11 Shielding zone
12 Non-shielding zone
13 Encapsulation layer
15 Shielding layer
16 Overflow
17 Groove
18 Bulge
19 Conductive layers
21 Non-conductive layers
23 Via
25 Top layer
27 Bottom layer
29 Cut layers in multilayer board
31 Uncut layers in multilayer board
32 Undercut
33 First angle
35 Second angle
37 Third angle
39 Fourth angle
50 In-ear-type hearing device
60 Behind-the-ear-type hearing device
100 Method of manufacturing an electronic circuit board
101 Provide circuit board
102A Provide plurality of circuit board layers
102B Make through-holes in one or more circuit board layers
102C Assemble plurality of circuit board layers
103 Define shielding zone
105 Provide groove
107 Apply encapsulation layer
107A Apply liquid encapsulation layer
107B Cure encapsulation layer
109 Apply shielding layer
109A Apply liquid shielding layer
109b Cure shielding layer
A Cross-section line
D Depth of groove
EC Ear canal
W Width of groove

The invention claimed is:

1. A method of processing a circuit board, the method comprising:
   obtaining a circuit board comprising a first surface and an opposing second surface, the circuit board further comprising a ground connection and one or more electronic components, wherein the circuit board comprises a groove extending below the first surface of the circuit board;
   applying an insulating encapsulation layer to cover the one or more electronic components; and
   applying an electrically conductive shielding layer on top of at least a part of the insulating encapsulation layer and to the ground connection so that the electrically conductive shielding layer is electrically coupled to the ground connection, whereby the one or more electronic components are electromagnetically shielded, wherein a first part of the applied electrically conductive shielding layer is on the first surface of the circuit board outside the groove.

2. The method of claim 1, wherein a maximum depth of the groove at the circuit board is between 5 and 200 micrometres, and/or wherein a maximum width of the groove at the circuit board is between 100 and 500 micrometres.

3. The method of claim 1, wherein the act of applying the insulating encapsulation layer comprises applying a liquid encapsulation material and/or wherein the act of applying the electrically conductive shielding layer comprises applying a liquid shielding material.

4. The method of claim 3, wherein the act of applying the insulating encapsulation layer further comprises curing the liquid encapsulation material, and/or wherein the act of applying the electrically conductive shielding layer further comprises curing the liquid shielding material.

5. The method of claim 1, wherein the circuit board is a multilayer circuit board comprising a plurality of circuit board layers, the plurality of circuit board layers comprising interleaved conductive and non-conductive layers, and wherein the groove is in one or more of the plurality of circuit board layers.

6. The method of claim 1, wherein the groove encircles the one or more electronic components, or wherein the groove is one of a plurality of grooves that encircle the one or more electronic components.

7. The method of claim 1, wherein an entirety of the applied insulating encapsulation layer is outside the groove.

8. The method of claim 1, wherein the groove is at a part of the circuit board that is between the one or more electronic components and the ground connection.

9. A method of processing a circuit board, the method comprising:
   obtaining a circuit board comprising a first surface and an opposing second surface, the circuit board further comprising a ground connection and one or more electronic components, wherein the circuit board comprises a groove extending below the first surface of the circuit board;
   applying an insulating encapsulation layer to cover the one or more electronic components; and applying an electrically conductive shielding layer on top of at least a part of the insulating encapsulation layer and to the ground connection so that the electrically conductive shielding layer is electrically coupled to the ground connection, whereby the one or more electronic components are electromagnetically shielded;

wherein the ground connection is inside the groove at an end of the groove, and is sandwiched between a part of the electrically conductive shielding layer inside the groove and a part of the circuit board.

10. A circuit board comprising:
a ground connection;
a first surface and an opposing second surface;
one or more electronic components;
a groove extending below the first surface;
an insulating encapsulation layer covering the one or more shielding-zone electronic components; and
an electrically conductive shielding layer on top of at least a part of the encapsulation layer, the electrically conductive shielding layer being coupled electrically to the ground connection, whereby the one or more electronic components are electromagnetically shielded;
wherein a first part of the applied electrically conductive shielding layer is on the first surface of the circuit board outside the groove.

11. The circuit board of claim 10, wherein the insulating encapsulation layer extends into the groove.

12. The circuit board of claim 10, wherein a maximum depth of the groove at the circuit board is between 5 and 200 micrometres, and/or wherein a maximum width of the groove at the circuit board is between 100 and 500 micrometres.

13. The circuit board of claim 10, wherein the circuit board is a multilayer circuit board comprising a plurality of layers, the plurality of layers comprising interleaved conductive and non-conductive layers, and wherein the groove is in one or more of the plurality of layers.

14. The circuit board of claim 13, wherein the groove extends through one, two, three, four, or five layers of the plurality of layers, or wherein the groove extends through less than or equal to half of the layers.

15. The circuit board of claim 10, wherein the groove encircles the one or more electronic components, or wherein the groove is one of a plurality of grooves that encircle the one or more electronic components.

16. A hearing device comprising the circuit board of claim 10.

17. The circuit board of claim 10, an entirety of the insulating encapsulation layer is outside the groove.

18. The circuit board of claim 10, wherein the groove is at a part of the circuit board that is between the one or more electronic components and the ground connection.

19. A circuit board comprising:
a ground connection;
a first surface and an opposing second surface;
one or more electronic components;
a groove extending below the first surface;
an insulating encapsulation layer covering the one or more shielding-zone electronic components; and
an electrically conductive shielding layer on top of at least a part of the encapsulation layer, the electrically conductive shielding layer being coupled electrically to the ground connection, whereby the one or more electronic components are electromagnetically shielded;
wherein the ground connection is inside the groove at an end of the groove, and is sandwiched between a part of the electrically conductive shielding layer inside the groove and a part of the circuit board.

20. A method of processing a circuit board, the method comprising:
obtaining a circuit board comprising a first surface and an opposing second surface, the circuit board further comprising a ground connection and one or more electronic components, wherein the circuit board comprises a groove extending below the first surface of the circuit board;
applying an insulating encapsulation layer to cover the one or more electronic components; and
applying an electrically conductive shielding layer on top of at least a part of the insulating encapsulation layer and to the ground connection so that the electrically conductive shielding layer is electrically coupled to the ground connection, whereby the one or more electronic components are electromagnetically shielded;
wherein an entirety of the applied insulating encapsulation layer is outside the groove.

21. A circuit board comprising:
a ground connection;
a first surface and an opposing second surface;
one or more electronic components;
a groove extending below the first surface;
an insulating encapsulation layer covering the one or more shielding-zone electronic components; and
an electrically conductive shielding layer on top of at least a part of the encapsulation layer, the electrically conductive shielding layer being coupled electrically to the ground connection, whereby the one or more electronic components are electromagnetically shielded;
wherein an entirety of the insulating encapsulation layer is outside the groove.

* * * * *